(12) United States Patent
Miyake

(10) Patent No.: US 9,058,889 B2
(45) Date of Patent: Jun. 16, 2015

(54) PULSE OUTPUT CIRCUIT, DISPLAY DEVICE, AND ELECTRONIC DEVICE

(71) Applicant: Semiconductor Energy Laboratory Co., Ltd., Atsugi-shi, Kanagawa-ken (JP)

(72) Inventor: Hiroyuki Miyake, Ebina (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 64 days.

(21) Appl. No.: 13/937,559

(22) Filed: Jul. 9, 2013

(65) Prior Publication Data
US 2014/0023173 A1 Jan. 23, 2014

(30) Foreign Application Priority Data
Jul. 20, 2012 (JP) ................................ 2012-161253

(51) Int. Cl.
*G11C 19/00* (2006.01)
*G11C 19/18* (2006.01)
*G11C 19/28* (2006.01)

(52) U.S. Cl.
CPC ...... *G11C 19/188* (2013.01); *G09G 2310/0286* (2013.01); *G11C 19/184* (2013.01); *G11C 19/28* (2013.01)

(58) Field of Classification Search
None
See application file for complete search history.

(56) References Cited

U.S. PATENT DOCUMENTS

| | | |
|---|---|---|
| 6,788,108 B2 | 9/2004 | Miyake et al. |
| 6,975,142 B2 | 12/2005 | Azami et al. |
| 7,057,598 B2 | 6/2006 | Azami et al. |
| 7,091,749 B2 | 8/2006 | Miyake et al. |
| 7,362,139 B2 | 4/2008 | Miyake et al. |
| 7,586,478 B2 | 9/2009 | Azami et al. |
| 7,651,896 B2 | 1/2010 | Honda et al. |
| 7,674,650 B2 | 3/2010 | Akimoto et al. |
| RE41,215 E | 4/2010 | Miyake et al. |
| 7,710,384 B2 | 5/2010 | Azami et al. |
| 7,732,819 B2 | 6/2010 | Akimoto et al. |
| 7,903,079 B2 | 3/2011 | Azami et al. |
| 7,910,490 B2 | 3/2011 | Akimoto et al. |
| 7,932,521 B2 | 4/2011 | Akimoto et al. |
| 7,977,168 B2 | 7/2011 | Honda et al. |
| 8,019,039 B1 * | 9/2011 | Tsai ............................... 377/64 |
| 8,134,156 B2 | 3/2012 | Akimoto |
| 8,158,464 B2 | 4/2012 | Akimoto |
| RE43,401 E | 5/2012 | Miyake et al. |
| 8,264,445 B2 | 9/2012 | Azami et al. |
| 8,274,077 B2 | 9/2012 | Akimoto et al. |
| 8,284,151 B2 | 10/2012 | Azami et al. |

(Continued)

FOREIGN PATENT DOCUMENTS

JP 2002-335153 A 11/2002

*Primary Examiner* — Tuan T Lam
(74) *Attorney, Agent, or Firm* — Eric J. Robinson; Robinson Intellectual Property Law Office, P.C.

(57) ABSTRACT

An object is to suppress the stress applied to a transistor as well as suppressing generation of defective operation. In a pulse output circuit having a function of outputting a pulse signal and including a transistor that controls whether to set the pulse signal to high level, in a period during which the pulse signal output from the pulse output circuit is at low level, the potential of a gate of a transistor is not set to a constant value but intermittently set to a value higher than the potential VSS. Accordingly, the stress to the transistor can be suppressed.

20 Claims, 11 Drawing Sheets

(56) References Cited

U.S. PATENT DOCUMENTS

| | | | |
|---|---|---|---|
| 8,306,177 B2 * | 11/2012 | Lee et al. ............... | 377/64 |
| 8,368,079 B2 | 2/2013 | Akimoto | |
| 8,427,417 B2 | 4/2013 | Koyama | |
| 8,466,463 B2 | 6/2013 | Akimoto et al. | |
| 8,471,620 B2 | 6/2013 | Koyama et al. | |
| 8,477,094 B2 * | 7/2013 | Jung et al. ............. | 345/100 |
| 8,558,601 B2 * | 10/2013 | Jang et al. ............. | 327/295 |
| 8,723,765 B2 * | 5/2014 | Kang et al. ............ | 345/82 |
| 2004/0218710 A1 * | 11/2004 | Shih et al. ............. | 377/64 |
| 2008/0308796 A1 | 12/2008 | Akimoto et al. | |
| 2008/0308805 A1 | 12/2008 | Akimoto et al. | |
| 2009/0008639 A1 | 1/2009 | Akimoto et al. | |
| 2009/0186445 A1 | 7/2009 | Akimoto | |
| 2009/0189155 A1 | 7/2009 | Akimoto | |
| 2009/0189156 A1 | 7/2009 | Akimoto | |
| 2009/0305461 A1 | 12/2009 | Akimoto et al. | |
| 2010/0003783 A1 | 1/2010 | Akimoto | |
| 2010/0136743 A1 | 6/2010 | Akimoto et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0260160 A1 | 10/2011 | Honda et al. | |
| 2013/0057161 A1 | 3/2013 | Azami et al. | |
| 2013/0063328 A1 | 3/2013 | Azami et al. | |

* cited by examiner

PULSE OUTPUT CIRCUIT, DISPLAY DEVICE, AND ELECTRONIC DEVICE

BACKGROUND OF THE INVENTION

1. Field of the Invention

The present invention relates to a pulse output circuit. Further, the present invention relates to a display device. Furthermore, the present invention relates to an electronic device.

2. Description of the Related Art

In recent years, for the purpose of simplifying the manufacturing process, circuits composed of only transistors having the same conductivity type (also referred to as circuits composed of only n-channel transistors or p-channel transistors) have been developed.

As an example of the circuits composed of only transistors having the same conductivity type, a pulse output circuit included in a shift register can be given.

For example, Patent Document 1 discloses a shift register including a plurality of stages of pulse output circuits that use pulses of a clock signal to generate pulses of a pulse signal. Further, Patent Document 1 discloses a shift register that utilizes bootstrap to prevent the amplitude of an output pulse signal from being lower than the amplitude of a clock signal.

REFERENCE

[Patent Document 1] Japanese Published Patent Application No. 2002-335153

SUMMARY OF THE INVENTION

However, conventional pulse output circuits have a problem of variation in electrical characteristics of a transistor when the transistor deteriorates owing to high amplitude of a clock signal.

For example, in the shift register in Patent Document 1, when a pulse signal output from a pulse output circuit is at low level, the potential of a gate of a transistor that controls whether to set the output pulse signal to high level (e.g., the transistor 105 in FIG. 1B in Patent Document 1) is held at a potential VSS for a certain period. At this time, the potential of a source or a drain of the above transistor changes repeatedly in accordance with a clock signal; thus, the transistor is subjected to stress. This causes deterioration of the transistor. In particular, the time during which the transistor is subjected to the stress is extremely long in the shift register in Patent Document 1; thus, the transistor easily deteriorates and the electrical characteristics keeps varying.

As a measure to suppress the influence of the stress applied to the transistor, there is a method of lengthening the channel length of the transistor, for example. However, if the channel length of the transistor that controls whether to set the output pulse signal to high level is lengthened, a problem of increasing the possibility of causing defective operation due to the delay of the output pulse signal by parasitic capacitance or the like arises, for example.

In consideration of the above problems, an object of one embodiment of the present invention is to suppress the stress applied to a transistor that controls whether to set the output pulse signal to high level as well as suppressing generation of defective operation.

In one embodiment of the present invention, in a period during which a pulse signal output from a pulse output circuit is at low level, the potential of a gate of a transistor that controls whether to set the pulse signal to high level is not set to a constant value but intermittently set to a value higher than the potential VSS. Accordingly, the stress to the transistor can be suppressed.

One embodiment of the present invention is a pulse output circuit having a function of generating a pulse signal in accordance with a set signal, a reset signal, a first clock signal, a second clock signal, and an inverted signal of the second clock signal. The pulse output circuit includes a first transistor, a second transistor, a third transistor, and a fourth transistor. A potential of one of a source and a drain of the first transistor changes in accordance with the first clock signal, and a potential of the other of the source and the drain of the first transistor is a potential of the pulse signal. A first potential is applied to one of a source and a drain of the second transistor, and the other of the source and the drain of the second transistor is electrically connected to the other of the source and the drain of the first transistor. A second potential is applied to one of a source and a drain of the third transistor, the other of the source and the drain of the third transistor is electrically connected to a gate of the first transistor, and a potential of a gate of the third transistor changes in accordance with the second clock signal. A potential of one of a source and a drain of the fourth transistor changes in accordance with the set signal and the reset signal, the other of the source and the drain of the fourth transistor is electrically connected to the gate of the first transistor, and a potential of a gate of the fourth transistor changes in accordance with the inverted signal of the second clock signal. Further, a difference between the first potential and the second potential is larger than a threshold voltage of the first transistor. Further, when the second clock signal is at high level, the first clock signal is at low level.

With one embodiment of the present invention, without lengthening the channel length of a transistor that controls whether to set the output pulse signal to high level, the stress to the transistor can be reduced. As a result, deterioration of the transistor can be suppressed, and variation in electrical characteristics can be suppressed.

BRIEF DESCRIPTION OF THE DRAWINGS

In the accompanying drawings:

FIGS. 7A, 7B1, and 7B2 illustrate an example of a display device;

DETAILED DESCRIPTION OF THE INVENTION

Embodiments of the present invention will be described below. Note that it will be readily appreciated by those skilled in the art that details of the embodiments can be modified without departing from the spirit and scope of the present invention. Thus, the present invention should not be limited to, for example, the description of the following embodiments.

Note that the contents in different embodiments can be combined with one another as appropriate. In addition, the contents of the embodiments can be replaced with each other as appropriate.

Ordinal numbers such as "first" and "second" are used in order to avoid confusion among components and the number of components is not limited by the ordinal numbers.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

Embodiment 1

In this embodiment, an example of a pulse output circuit will be described.

Figure 1A:
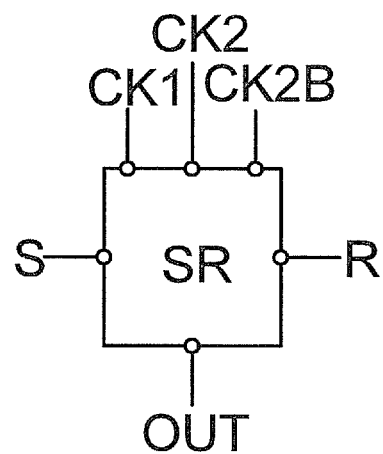
FIGS. 1A and 1B illustrate an example of a pulse output circuit.
Figure 1B:
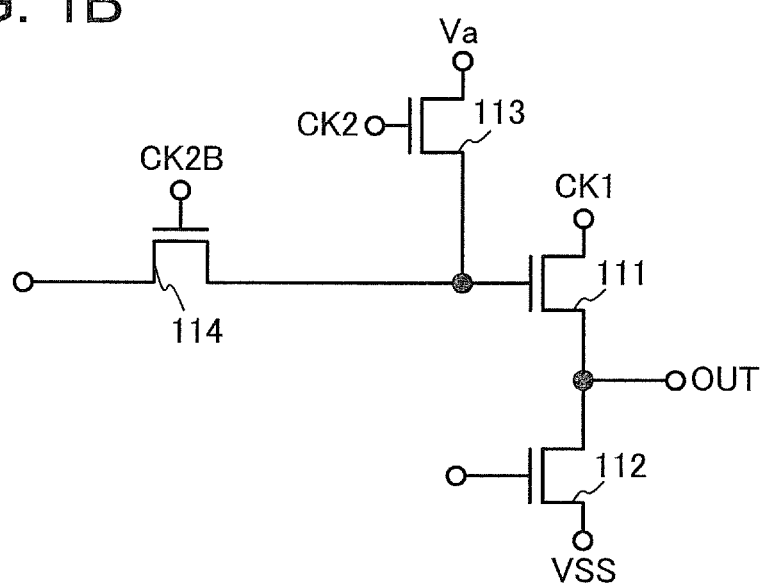

FIGS. 1A and 1B illustrate an example of a pulse output circuit of this embodiment. As illustrated in FIG. 1A, a pulse output circuit SR has a function of generating a pulse signal as an output signal OUT in accordance with input signals such as a set signal S, a reset signal R, a clock signal CK1, a clock signal CK2, and a clock signal CK2B. The clock signal CK2B can be an inverted signal of the clock signal CK2 or another clock signal.

The pulse output circuit SR illustrated in FIG. 1A includes transistors 111 to 114 as illustrated in FIG. 1B. The transistors 111 to 114 have the same conductivity type. The conduction of each of the transistors 111 to 114 is controlled by one or some of the set signal S, the reset signal R, the clock signal CK1, the clock signal CK2, and the clock signal CK2B. Note that an element other than the transistors 111 to 114 may be provided in the pulse output circuit SR illustrated in FIG. 1A.

The potential of one of a source and a drain of the transistor 111 changes in accordance with the clock signal CK1, and the potential of the other is the potential of the pulse signal (output signal OUT). The transistor 111 has a function of controlling whether to set the pulse signal (output signal OUT) to high level.

Note that the phrase "a potential changes in accordance with a signal" does not only mean the case of "directly inputting a signal to change a potential to the potential of the signal." For example, it also includes the case of "turning on a switch in accordance with the signal to change a potential" and the case of "changing a potential in accordance with a change of the signal due to capacitive coupling."

In addition, the expression "a potential that depends on a signal" does not only mean "the potential that is the same as the potential of the signal." For example, it also means the value changed from the potential of the signal owing to voltage drop.

A potential VSS is supplied to one of a source and a drain of the transistor 112, and the other of the source and the drain of the transistor 112 is electrically connected to the other of the source and the drain of the transistor 111. Further, the potential of a gate of the transistor 112 changes in accordance with the set signal S and the reset signal R. Note that the potential of the gate of the transistor 112 may be controlled with a clock signal that is different from the clock signal CK1 and the clock signal CK2. The transistor 112 has a function of controlling whether to set the pulse signal (output signal OUT) to low level by being turned on or off in accordance with the potential of the gate.

A potential Va is supplied to one of a source and a drain of the transistor 113, and the other is electrically connected to a gate of the transistor 111. Further, the potential of a gate of the transistor 113 changes in accordance with the clock signal CK2. The transistor 113 has a function of controlling whether to set the potential of the gate of the transistor 111 to a value that depends on the potential Va.

Note that the expression "a value that depends on a potential" does not only mean "the value that is the same as the potential." For example, it also means the value changed from the value of the potential owing to voltage drop.

The potential of one of a source and a drain of the transistor 114 changes in accordance with the set signal S and the reset signal R, and the other is electrically connected to the gate of the transistor 111. Further, the potential of the gate of the transistor 114 changes in accordance with the clock signal CK2B. The transistor 114 has a function of controlling whether to bring the gate of the transistor 111 into a floating state.

As the transistors 111 to 114, transistors including a semiconductor with wider bandgap than silicon in their channel formation regions can be used, for example. As the wide bandgap semiconductor, an oxide semiconductor can be used, for example. However, without being limited to the above transistors, the transistors 111 to 114 may be transistors including a semiconductor including a Group 14 element (such as silicon), for example. In this case, the semiconductor including a Group 14 element may be single-crystal, polycrystalline, or amorphous.

For example, an In-based metal oxide, a Zn-based metal oxide, an In—Zn-based metal oxide, an In—Ga—Zn-based metal oxide, or the like can be used as the oxide semiconductor. Alternatively, a metal oxide including another metal element instead of part or all of Ga in the In—Ga—Zn-based metal oxide may be used.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

The above is the description of the structure of the oxide semiconductor film.

Next, a configuration example of the pulse output circuit of this embodiment is described with reference to FIGS. 2A and 2B.

Figure 2A:
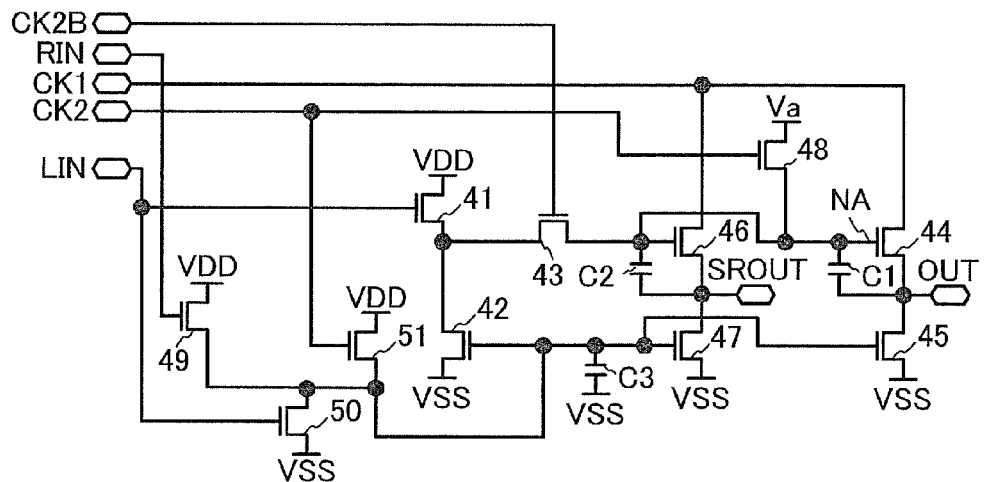
FIGS. 2A and 2B illustrate an example of a pulse output circuit.

The pulse output circuit illustrated in FIG. 2A has a function of generating an output signal OUT and an output signal SROUT in accordance with a set signal LIN corresponding to the set signal S, a reset signal RIN corresponding to the reset signal R, a clock signal CK1, a clock signal CK2, and a clock signal CK2B.

The pulse output circuit illustrated in FIG. 2A includes transistors 41 to 51.

A potential VDD is supplied to one of a source and a drain of the transistor 41. The set signal LIN is input to a gate of the transistor 41.

A potential VSS is supplied to one of a source and a drain of the transistor 42, and the other is electrically connected to the other of the source and the drain of the transistor 41.

One of a source and a drain of the transistor 43 is electrically connected to the other of the source and the drain of the transistor 41. The clock signal CK2B is input to a gate of the transistor 43. The transistor 43 corresponds to the transistor 114 illustrated in FIG. 1B.

The clock signal CK1 is input to one of a source and a drain of the transistor 44, and the potential of the other is the potential of the pulse signal (output signal OUT). A gate of the transistor 44 is electrically connected to the other of the source and the drain of the transistor 43. The transistor 44 corresponds to the transistor 111 illustrated in FIG. 1B.

Further, a capacitor C1 is formed between the gate of the transistor 44 and the other of the source and the drain of the transistor 44. For example, a parasitic capacitor between the gate and the other of the source and the drain of the transistor 44 may be used as the capacitor C1.

A potential VSS is supplied to one of a source and a drain of the transistor 45, and the other is electrically connected to the other of the source and the drain of the transistor 44. The transistor 45 corresponds to the transistor 112 illustrated in FIG. 1B.

The clock signal CK1 is input to one of a source and a drain of the transistor 46, and the potential of the other is the potential of a pulse signal (output signal SROUT). A gate of the transistor 46 is electrically connected to the other of the source and the drain of the transistor 43.

Further, a capacitor C2 is formed between the gate of the transistor 46 and the other of the source and the drain of the transistor 46. For example, a parasitic capacitor between the gate and the other of the source and the drain of the transistor 46 may be used as the capacitor C2. However, it is not always necessary to form the capacitor C2.

A potential VSS is supplied to one of a source and a drain of the transistor 47, and the other is electrically connected to the other of the source and the drain of the transistor 46. A gate of the transistor 47 is electrically connected to a gate of the transistor 42.

It is not always necessary to provide the transistors 46 and 47.

A potential Va is supplied to one of a source and a drain of the transistor 48, and the other is electrically connected to the gate of the transistor 44 and the gate of the transistor 46. A clock signal CK2 is input to a gate of the transistor 48. The transistor 48 corresponds to the transistor 113 illustrated in FIG. 1B.

A potential VDD is supplied to one of a source and a drain of the transistor 49, and the other is electrically connected to the gate of the transistor 45 and the gate of the transistor 47. A reset signal RIN is input to a gate of the transistor 49.

A potential VSS is supplied to one of a source and a drain of the transistor 50, and the other is electrically connected to the gate of the transistor 45 and the gate of the transistor 47. A set signal LIN is input to a gate of the transistor 50.

A potential VDD is supplied to one of a source and a drain of the transistor 51, and the other is electrically connected to the gate of the transistor 45 and the gate of the transistor 47. A clock signal CK2 is input to a gate of the transistor 51. The channel length of one or both of the transistors 48 and 51 may be set longer than the channel length of the transistor 44 or 46. When the channel length of the transistor 51 is set long, the influence of the stress to the transistor 51 can be reduced.

A potential VSS is supplied to one of a pair of electrodes of a capacitor C3. The other is electrically connected to the gate of the transistor 45 and the gate of the transistor 47. The capacitor C3 has a function of a storage capacitor. It is not always necessary to provide the capacitor C3.

As the transistors 41 to 51, transistors including the above-described oxide semiconductor in their channel formation regions can be used, for example.

Next, as an example of a method for driving the pulse output circuit of this embodiment, an example of a method for driving the pulse output circuit in FIG. 2A is described with reference to a timing chart in FIG. 2B. As an example, the description is given here on the following assumptions: the transistors 41 to 51 are each n-channel transistors; the potential VDD is a positive potential; the potential VSS is a negative potential; the potential Va is the same as the value of the potential VDD; the high level potentials of the set signal LIN, the reset signal RIN, the clock signal CK1, the clock signal CK2, and the clock signal CK2B are the same as the potential VDD; the low level potentials thereof are the same as the potential VSS; the difference between the potential Va and the low level potential of the clock signal CK1 is larger than the threshold voltage of the transistors 44 and 46; and the connection portion of the gate of the transistor 44 and other elements is a node NA.

Note that in this specification, the potential VSS is the lower potential of at least two power supply potentials that are necessary to operate the circuit. The potential VDD is the higher potential of the two power supply potentials.

Figure 2B:
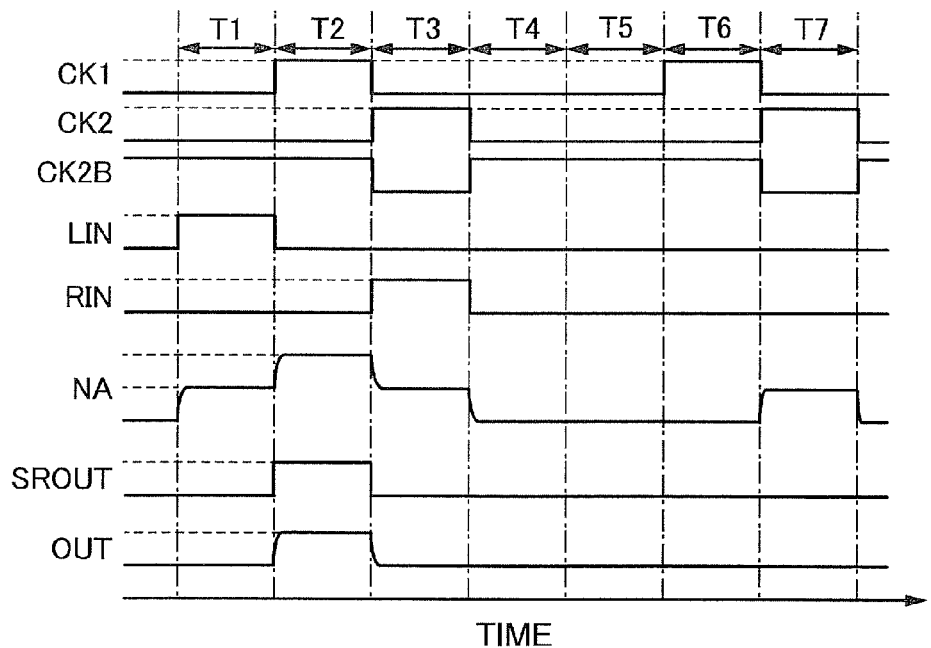

In the pulse output circuit illustrated in FIG. 2A, in a period T1 in FIG. 2B, the set signal LIN becomes high level, turning on the transistor 41 and the transistor 50. Since the reset signal RIN is at low level, the transistor 49 is in an off state. The clock signal CK1 is at low level. Further, the clock signal CK2 is at low level, turning off the transistor 48 and the transistor 51. The clock signal CK2B is at high level, turning on the transistor 43.

In this period, the potential of the node NA increases to a value equal to the potential VDD, which turns on the transistor 44 and the transistor 46, and then the transistor 41 and the transistor 43 are turned off. Since the clock signal CK1 is at low level, the output signal OUT and the output signal SROUT are at low level. In this manner, the pulse output circuit illustrated in FIG. 2A is brought into a set state.

Next, in a period T2, the set signal LIN becomes low level, turning off the transistor 41 and the transistor 50. The clock signal CK1 becomes high level. Since the reset signal RIN remains at low level, the transistor 49 remains in an off state. Further, since the clock signal CK2 remains at low level, the transistor 48 and the transistor 51 remain in an off state. The clock signal CK2B remains at high level.

In this period, the transistor 44 remains in an on state. Since the clock signal CK1 is at high level, the potential of the node NA increases to a value that is higher than the sum of the potential VDD and the threshold voltage of the transistor 44 (Vth44), that is, VDD+Vth44+Vx (Vx is an arbitrary potential), owing to capacitive coupling generated by the capacitor C1 between the gate and the other of the source and the drain of the transistor 44. This is what is called bootstrap operation. By this operation, the potential of the output signal OUT becomes a value equal to the high level potential of the clock signal CK1. Similarly, the potential of the output signal SROUT becomes a value equal to the high level potential of the clock signal CK1.

Next, in a period T3, the reset signal RIN becomes high level, turning on the transistor 49. The clock signal CK1 becomes low level. The clock signal CK2B becomes low level, turning off the transistor 43. The clock signal CK2 becomes high level, turning on the transistor 48 and the transistor 51. Since the set signal LIN remains at low level, the transistor 41 and the transistor 50 remain in an off state.

In this period, the transistor 42, the transistor 45, and the transistor 47 are in an on state. Since the transistor 48 is in an on state, the potential of the node NA becomes equal to the potential Va, which makes the transistor 44 and the transistor 46 remain in an on state. Since the clock signal CK1 is at low level, the potentials of the output signal OUT and the output signal SROUT become values equal to the low-level potential of the clock signal CK1. In this manner, the pulse output circuit illustrated in FIG. 2A is brought into a reset state.

Next, in a period T4, the reset signal RIN becomes low level, turning off the transistor 49. The clock signal CK2 becomes low level, turning off the transistor 48 and the transistor 51. Further, the clock signal CK2B becomes high level, turning on the transistor 43. Since the set signal LIN remains at low level, the transistor 41 and the transistor 50 remain in an off state. The clock signal CK1 remains at low level.

In this period, the transistor 42, the transistor 45, and the transistor 47 remain in an off state. Since the transistor 43 is in an on state, the potential of the node NA remains at the value equal to the potential VSS, which makes the transistor 44 and the transistor 46 remain in an off state. Further, since the clock signal CK1 remains at low level, the output signal OUT and the output signal SROUT remain at low level.

Next, in a period T5, the set signal LIN remains at low level, so that the transistor 41 and the transistor 50 remain in an off state. The reset signal RIN remains at low level, so that the transistor 49 remains in an off state. The clock signal CK1 remains at low level. Further, the clock signal CK2 remains at low level, so that the transistor 48 and the transistor 51 remain in an off state. Since the clock signal CK2B remains at high level, the transistor 43 remains in an on state.

In this period, the transistor 42, the transistor 45, and the transistor 47 remain in an off state. Further, since the transistor 43 is in an on state, the potential of the node NA remains at the value equal to the potential VSS, which makes the transistor 44 and the transistor 46 remain in an off state. Further, since the clock signal CK1 remains at low level, the output signal OUT and the output signal SROUT remain at low level.

Next, in a period T6, the clock signal CK1 becomes high level. The set signal LIN remains at low level, so that the transistor 41 and the transistor 50 remain in an off state. The reset signal RIN remains at low level, so that the transistor 49 remains in an off state. Further, the clock signal CK2 remains at low level, so that the transistor 48 and the transistor 51 remain in an off state. The clock signal CK2B remains at high level, so that the transistor 43 remains in an on state.

In this period, the transistor 42, the transistor 45, and the transistor 47 remain in an on state. Further, since the transistor 43 is in an on state, the potential of the node NA remains at the value equal to the potential VSS, which makes the transistor 44 and the transistor 46 remain in an off state. At this time, although the clock signal CK1 is at high level, the output signal OUT and the output signal SROUT remain at low level since the transistor 44 and the transistor 46 are in an off state.

Next, in a period T7, the clock signal CK2 becomes high level, turning on the transistor 48 and the transistor 51. The clock signal CK2B becomes low level, turning off the transistor 43. The clock signal CK1 becomes low level. The set signal LIN remains at low level, so that the transistor 41 and the transistor 50 remain in an off state. The reset signal RIN remains at low level, so that the transistor 49 remains in an off state. When the clock signal CK2 is at high level, the clock signal CK1 is at low level.

In this period, the transistor 42, the transistor 45, and the transistor 47 remain in an on state. Further, since the transistor 48 is in an on state, the potential of the node NA remains at the value equal to the potential Va, which turns on the transistor 44 and the transistor 46. However, since the clock signal CK1 is at low level, the output signal OUT and the output signal SROUT remain at low level.

In the above-described manner, in accordance with the clock signal CK2, the potential of the node NA is intermittently changed to the value equal to the potential Va. When the potential of the node NA is the value equal to the potential Va, the potential of one of the source and the drain of the transistor 44 and the potential of one of the source and the drain of the transistor 46 are the value equal to the low level potential of the clock signal CK1. Further, when the potential of the node NA is the value equal to the potential VSS, the potential of one of the source and the drain of the transistor 44 and the potential of one of the source and the drain of the transistor 46 are the value equal to the high level potential of the clock signal CK1. Accordingly, the voltage between the gate and one of the source and the drain in each of the transistors 44 and 46 is always lower than a difference between the potential VDD and the potential VSS. Thus, the stress to the transistor 44 can be reduced.

The above is the description of the pulse output circuit illustrated in FIG. 2A.

The configuration of the pulse output circuit of this embodiment is not limited to the above-described configuration, and another configuration can also be employed.

Figure 3:
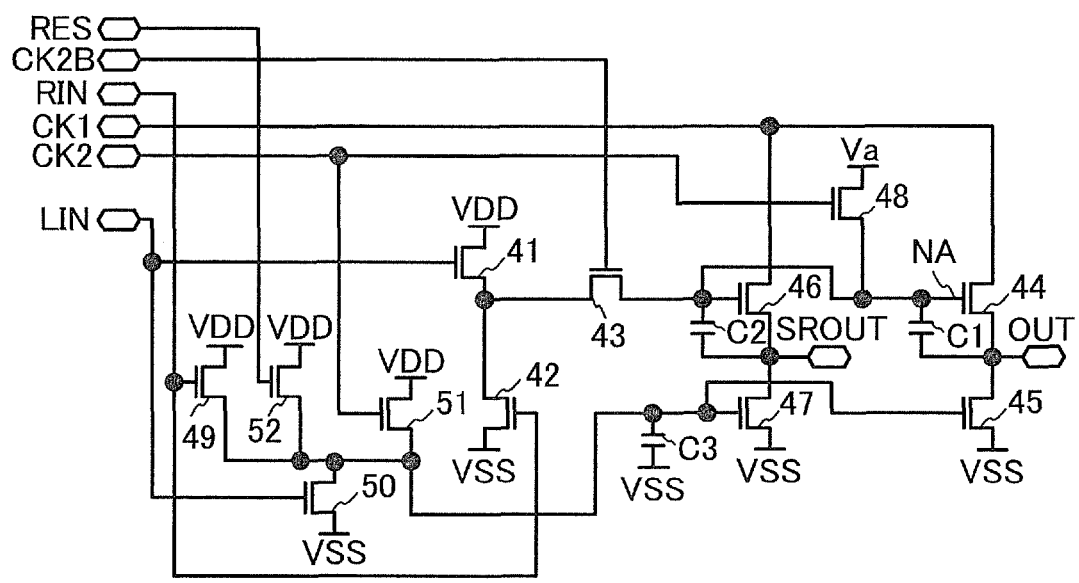
FIG. 3 illustrates an example of a pulse output circuit.

For example, a pulse output circuit in FIG. 3 has a configuration in which, instead of electrically connecting the gate of the transistor 42 to the gate of the transistor 45 and the gate of the transistor 47 as in FIG. 2B, a reset signal RIN is input to the gate of the transistor 42. This configuration can accelerate the time taken for the potential of the node NA to reach the value equal to the potential VSS at the time of bringing the pulse output circuit into a reset state. Further, as illustrated in FIG. 3, the transistor 52 may be provided. A potential VDD is supplied to one of a source and a drain of the transistor 52, and the other is electrically connected to the transistor 45 and the transistor 47. Further, an initialization signal RES is input to a gate of the transistor 52. In the pulse output circuit illustrated in FIG. 3, by inputting a pulse of the initialization signal RES, the transistor 45 and the transistor 47 are turned on, so that the signal OUT and the signal SROUT are set at low level; thus, an initialization state is created.

Figure 4:
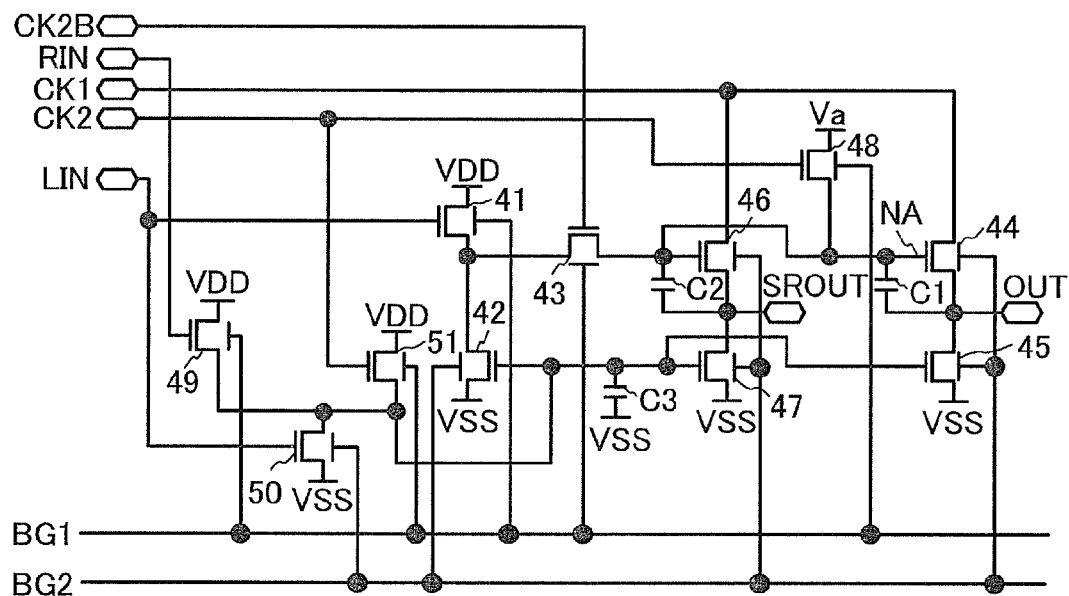
FIG. 4 illustrates an example of a pulse output circuit.

As illustrated in FIG. 4, each of the transistors 41 to 51 may have a back gate; the threshold voltage of each of the transistors 41 to 51 can be controlled by the control of the potential of the back gate. For example, when a negative potential is applied to a back gate of an n-channel transistor, the threshold voltage of the n-channel transistor can be shifted in a positive direction. In the pulse output circuit illustrated in FIG. 4, a potential BG1 is applied to each of the back gates of the transistor 41, the transistor 43, the transistor 48, the transistor 49, and the transistor 51, and a potential BG2 is applied to each of the back gates of the transistor 42, the transistor 44, the transistor 45, the transistor 46, the transistor 47, and the transistor 50. In the case of using negative potentials as the potential BG1 and the potential BG2, the value of the potential BG2 is preferably lower than the potential BG1 because when the threshold voltage of the transistor to which the potential BG1 is supplied is too high, defective operation easily occurs in the pulse output circuit.

Note that the transistors in the configuration illustrated in FIG. 3 may also have back gates.

Further, an example of a shift register including a plurality of stages of pulse output circuit illustrated in FIG. 2A is described with reference to FIGS. 5A to 5C.

Figure 5A:
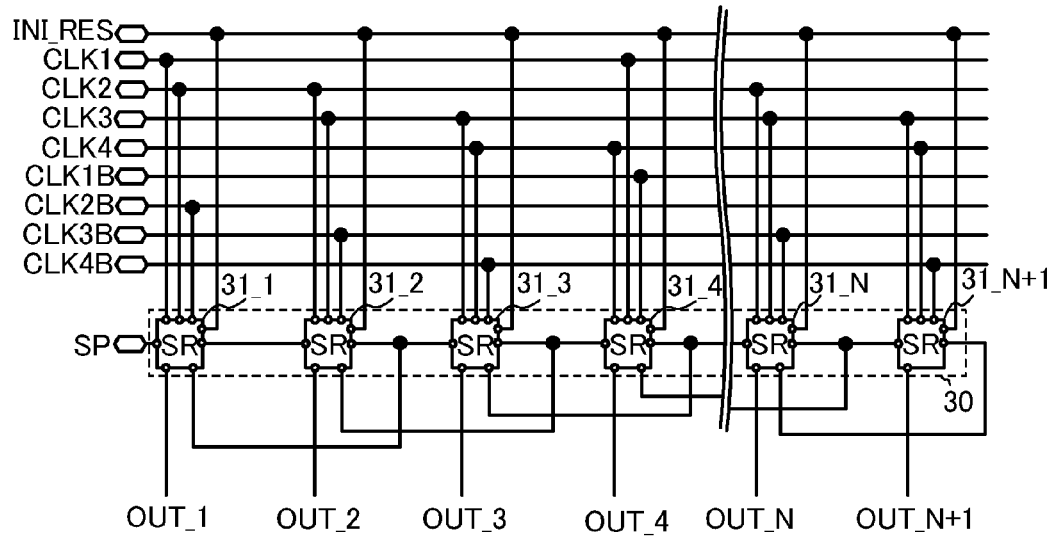
FIGS. 5A to 5C illustrates an example of a pulse output circuit.
Figure 5B:
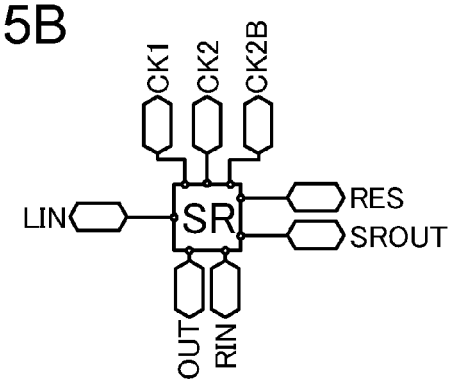

A shift register 30 illustrated in FIG. 5A includes a plurality of stages of pulse output circuits (pulse output circuits 31_1 to 31_N (N is a natural number of greater than or equal to 2)). FIG. 5A illustrates a case where N is 5 as an example.

Each of the pulse output circuits 31_1 to 31_N corresponds to the pulse output circuit illustrated in FIG. 2A. As illustrated in FIG. 5B, the pulse output circuits 31_1 to 31_N have a function of generating and outputting a plurality of pulse signals as an output signal OUT and an output signal SROUT in accordance with a set signal LIN, a reset signal RIN, an initialization signal RES, a clock signal CK1, a clock signal CK2, and a clock signal CK2B.

A start pulse signal SP is input to the pulse output circuit 31_1 as the set signal LIN. Further, a pulse signal that is the output signal SROUT output from a pulse output circuit 31_K−1 (K is a natural number of greater than or equal to 2 and less than or equal to N) is input to the pulse output circuit 31_K as the set signal LIN.

A pulse signal that is the output signal SROUT output from the pulse output circuit 31_M+1 (M is a natural number of less than or equal to N−1) is input to the pulse output circuit 31_M as the reset signal RIN.

A clock signal CLK1, a clock signal CLK2, and an inverted clock signal CLK2B of the clock signal CLK2 are input to the pulse output circuit 31_1 as the clock signal CK1, the clock signal CK2, and the clock signal CK2B, respectively. Further, the clock signal CLK1, the clock signal CLK2, and the inverted clock signal CLK2B are input to every fourth pulse output circuit from the pulse output circuit 31_1 as the clock signal CK1, the clock signal CK2, and the clock signal CK2B, respectively.

In addition, the clock signal CLK2, a clock signal CLK3, and an inverted clock signal CLK3B of the clock signal CLK3 are input to the pulse output circuit 31_2 as the clock signal CK1, the clock signal CK2, and the clock signal CK2B, respectively. Further, the clock signal CLK2, the clock signal CLK3, and the inverted clock signal CLK3B are input to every fourth pulse output circuit from the pulse output circuit 31_2 as the clock signal CK1, the clock signal CK2, and the clock signal CK2B, respectively.

Moreover, the clock signal CLK3, a clock signal CLK4, and an inverted clock signal CLK4B of the clock signal CLK4 are input to the pulse output circuit 31_3 as the clock signal CK1, the clock signal CK2, and the clock signal CK2B, respectively. Further, the clock signal CLK3, the clock signal CLK4, and the inverted clock signal CLK4B are input to every fourth pulse output circuit from the pulse output circuit 31_3 as the clock signal CK1, the clock signal CK2, and the clock signal CK2B, respectively.

Moreover, the clock signal CLK4, the clock signal CLK1, and an inverted clock signal CLK1B of the clock signal CLK1 are input to the pulse output circuit 31_4 as the clock signal CK1, the clock signal CK2, and the clock signal CK2B, respectively. Further, the clock signal CLK4, the clock signal CLK1, and the inverted clock signal CLK1B are input to every fourth pulse output circuit from the pulse output circuit 31_4 as the clock signal CK1, the clock signal CK2, and the clock signal CK2B, respectively.

The pulse output circuit 31_N+1 is a pulse output circuit in a dummy stage. The pulse output circuit 31_N+1 has a configuration of the pulse output circuit illustrated in FIG. 2A without the transistor 49. A pulse signal of the output signal SROUT_N+1 output from the pulse output circuit 31_N+1 is input to the pulse output circuit 31_N as the reset signal RIN. Note that without providing the pulse output circuit 31_N+1, a pulse signal generated separately may be input to the pulse output circuit 31_N.

Further, an initialization signal INI_RES is input to each of the pulse output circuits 31_1 to 31_N+1 as the initialization signal RES.

The inverted clock signals CLK1B to CLK4B are generated by inverting the clock signals CLK1 to CLK4 with an inverter or the like, for example.

An example of a method for driving the shift register 30 illustrated in FIG. 5A is described with reference to a timing chart in FIG. 5C. As an example, the description is given here on the following assumptions. The potential VDD is a positive potential, the potential VSS is a negative potential, and the potential Va is a value equal to the potential VDD. Further, the high level potentials of the set signal LIN, the reset signal RIN, the clock signals CLK1 to CLK4, and the inverted clock signals CLK1B to CLK4B are the same as the potential VDD, and the low level potentials thereof are the same as the potential VSS. Furthermore, the duty ratio of the clock signals CLK1 to CLK4 is 25%. Further, the clock signal CLK2 is delayed from the clock signal CLK1 by ¼ cycle, the clock signal CLK3 is delayed from the clock signal CLK2 by ¼ cycle, and the clock signal CLK4 is delayed from the clock signal CLK3 by ¼ cycle. In addition, the pulse width of the start pulse signal SP is the same as the pulse width of the clock signals CLK1 to CLK4. Before each pulse output circuit is brought into a set state, a pulse of the initialization signal INI_RES is input to perform initialization of the pulse output circuit.

Figure 5C:
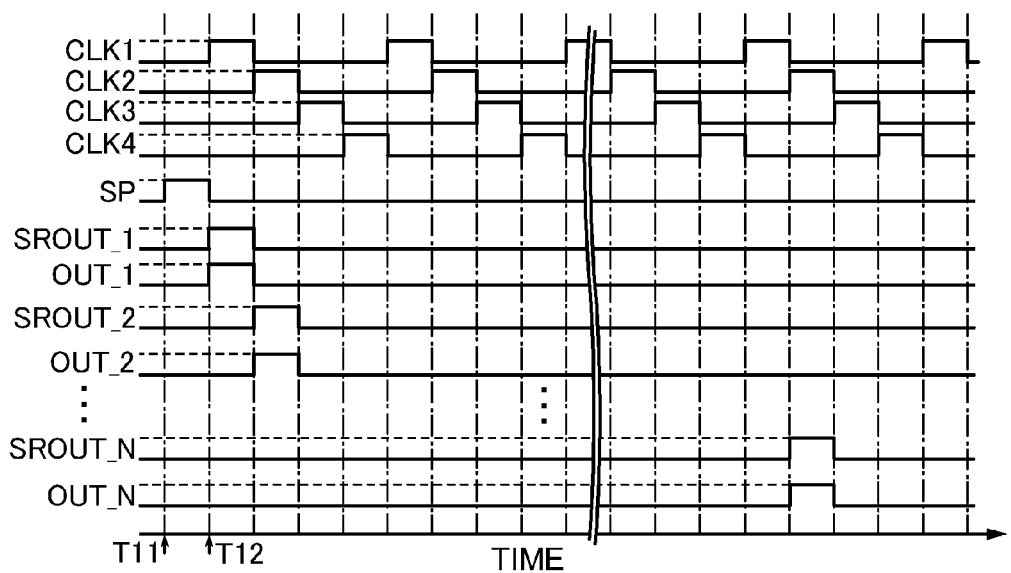

As illustrated in FIG. 5C, in the shift register 30 illustrated in FIG. 5A, by setting the start pulse signal SP at high level at Time T11, the clock signal CLK1 becomes high level at Time T12. Further, the shift register 30 sequentially outputs pulses of the output signals SROUT_1 to SROUT_N and pulses of the output signals OUT_1 to OUT_N in accordance with the clock signals CLK1 to CLK4 and the inverted clock signals CLK1B to CLK4B (not illustrated).

The above is the description of the example of the method for driving the shift register 30 illustrated in FIG. 5A.

A protection circuit may be provided in the shift register 30 illustrated in FIG. 5A. For example, the shift register 30 illustrated in FIG. 6A has the configuration of the shift register 30 illustrated in FIG. 5A in which protection circuits 32 are connected to wirings through which the initialization signal INI_RES, the clock signals CLK1 to CLK4, the inverted clock signals CLK1B to CLK4B, and the start pulse signal SP are input.

Figure 6A:
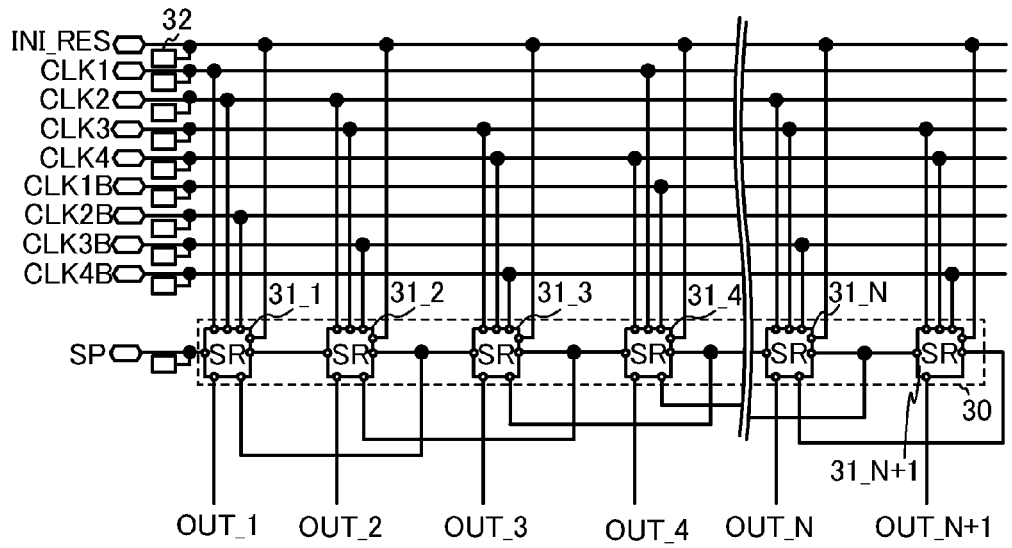
FIGS. 6A and 6B each illustrate an example of a pulse output circuit.
Figure 6B:
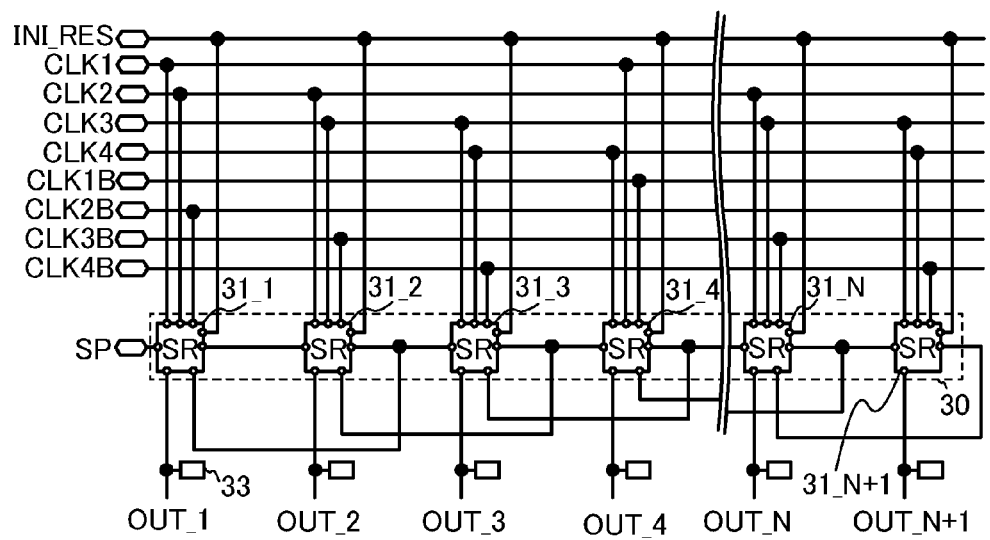

The shift register 30 illustrated in FIG. 6B has a configuration in which wirings through which the output signals OUT_1 to OUT_N are output from the shift register 30 illustrated in FIG. 5A are connected to protection circuits 33.

The shift register 30 illustrated in FIG. 5A may be provided with the protection circuits 32 illustrated in FIG. 6A and the protection circuits 33 illustrated in FIG. 6B.

Each of the protection circuits 32 and 33 is a circuit which electrically connects a wiring to which the protection circuit itself is connected to another power supply line when a potential out of a certain range is applied to the wiring. The protection circuits 32 and 33 include a diode or the like, for example.

By providing protection circuits as illustrated in FIGS. 6A and 6B, tolerance to overvoltage generated by electrostatic discharge (ESD) or the like in the shift register can be increased.

In the example of the pulse output circuit of this embodiment, as described with reference to FIGS. 1A and 1B, FIGS. 2A and 2B, FIG. 3, FIG. 4, FIGS. 5A to 5C, and FIGS. 6A and 6B, in a period during which the output pulse signal is at low level, the potential of the gate of the transistor 111 is not set to a constant value but intermittently set to a value higher than the potential VSS. Accordingly, the stress to the transistor 111 can be suppressed, which can suppress deterioration of the transistor.

Embodiment 2

In this embodiment, examples of a display device including the pulse output circuit of Embodiment 1 is described with reference to FIGS. 7A, 7B1, and 7B2, FIG. 8, FIG. 9, and FIGS. 10A and 10B.

Figure 7A:
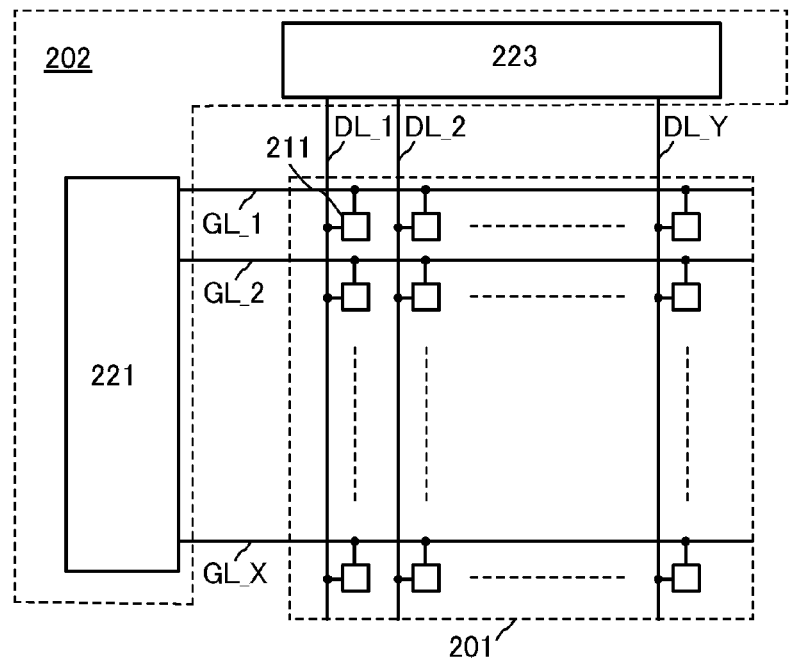
Figure 7A:
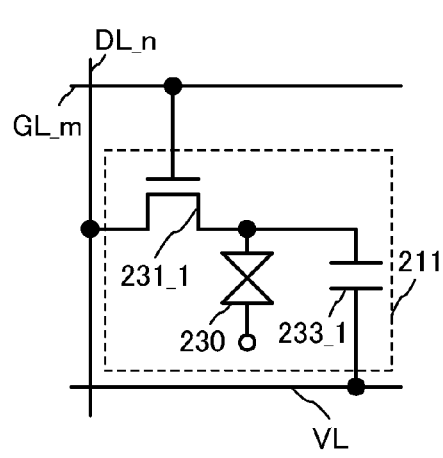
Figure 7A:
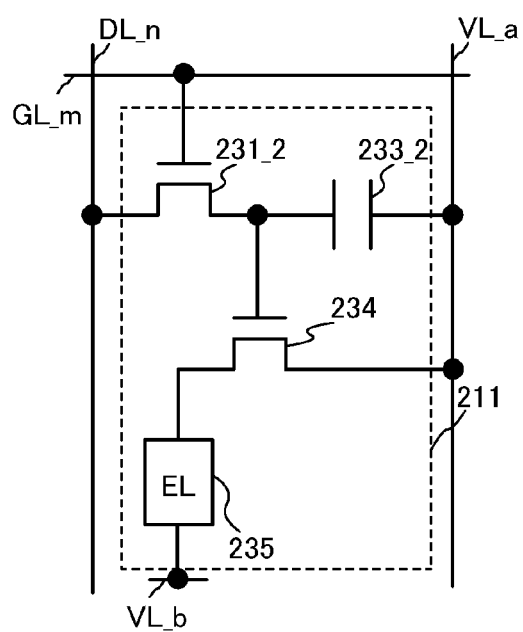

The display device in FIG. 7A includes a pixel portion 201 and a driver circuit portion 202.

The pixel portion 201 includes a plurality of pixel circuits 211 arranged in X rows (X is a natural number of greater than or equal to 2) and Y columns (Y is a natural number of greater than or equal to 2). The driver circuit portion 202 includes driver circuits such as a gate driver 221 and a source driver 223.

The gate driver 221 includes a shift register including a plurality of stages of pulse output circuits described in Embodiment 1 (e.g., the shift register 30 illustrated in FIG. 5A). For example, the gate driver 221 has a function of controlling potentials of scan lines GL_1 to GL_X in accordance with a pulse signal output from the shift register. Note that a plurality of gate drivers 221 may be provided to separately control the scan lines GL_1 to GL_X.

Image signals are input to the source driver 223. The source driver 223 has a function of generating data signals written in the pixel circuits 211 based on the image signals. The source driver 223 has a function of controlling potentials of data lines DL_1 to DL_Y.

The source driver 223 is formed using a plurality of analog switches or the like, for example. The source driver 223 can output signals obtained by time-dividing the image signal as the data signals by sequentially turning on the plurality of analog switches. The source driver 223 may be formed using a shift register or the like. In this case, a shift register including a plurality of stages of the pulse output circuits described in Embodiment 1 (e.g., the shift register illustrated in FIG. 5A) can be used.

A pulse signal and a data signal are input to one of the plurality of pixel circuits 211 through one of the plurality of scan lines GL and one of the plurality of data lines DL, respectively. Writing and holding of the data signal in each of the plurality of pixel circuits 211 are performed by the gate driver 221. For example, to the pixel circuit 211 in m-th row and n-th column (m is a natural number of less than or equal to X, and n is a natural number of less than or equal to Y), a pulse signal is input from the gate driver 221 through the scan line GL_m, and a data signal is input from the source driver 223 through the data line DL_n depending on the potential of the scan line GL_m.

As illustrated in FIG. 7B1, the plurality of pixel circuits 211 each includes a liquid crystal element 230, a transistor 231_1, and a capacitor 233_1.

The potential of one of a pair of electrodes of the liquid crystal element 230 is set according to the specifications of the pixel circuit 211 as appropriate. The alignment state of the liquid crystal element 230 depends on written data. A common potential may be applied to one of the pair of electrodes of the liquid crystal element 230 included in each of the plurality of pixel circuits 211. Further, the potential applied to the other of the pair of electrodes of the liquid crystal element 230 may be varied depending on the pixel circuits 211 in each row.

As a display mode of the display device including a liquid crystal element, any of the following modes can be used, for example: a TN (twisted nematic) mode, an IPS (in-plane-switching) mode, an STN (super twisted nematic) mode, a VA (vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA (multi-domain vertical alignment) mode, a PVA (patterned vertical alignment) mode, an FFS (fringe field switching) mode, a TBA (transverse bend alignment) mode, and the like.

The liquid crystal element may be formed using a liquid crystal composition including a liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel circuit 211 in the m-th row and the n-th column, one of a source and a drain of the transistor 231_1 is electrically connected to the data line DL_n, and the other is electrically connected to the other of the pair of electrodes of the liquid crystal element 230. A gate of the transistor 231_1 is electrically connected to the scan line GL_m. The transistor 231_1 has a function of controlling whether to write a data signal by being turned on or off.

One of a pair of electrodes of the capacitor 233_1 is electrically connected to a potential supply line VL, and the other is electrically connected to the other of the pair of electrodes of the liquid crystal element 230. The potential of the potential supply line VL is set according to the specifications of the pixel circuit 211 as appropriate. The capacitor 233_1 functions as a storage capacitor for retaining written data.

In the display device including the pixel circuit 211 illustrated in FIG. 7B1, the pixel circuits 211 are sequentially selected row by row by the gate driver 221, whereby the transistors 231_1 are turned on and a data signal is written.

When the transistors 231_1 are turned off, the pixel circuits 211 in which the data has been written are brought into a holding state. This operation is sequentially performed row by row; thus, an image is displayed.

The pixel circuit 211 illustrated in FIG. 7B2 includes a transistor 231_2, a capacitor 233_2, a transistor 234, and a light-emitting element (also referred to as EL) 235.

One of a source and a drain of the transistor 231_2 is electrically connected to the data line DL_n. A gate of the transistor 231_2 is electrically connected the scan line GL_m.

The transistor 231_2 has a function of controlling whether to write a data signal by being turned on or off.

One of a pair of electrodes of the capacitor 233_2 is electrically connected to a power supply line VL_a, and the other is electrically connected to the other of the source and the drain of the transistor 231_2.

The capacitor 233_2 functions as a storage capacitor for retaining written data.

One of a source and a drain of the transistor 234 is electrically connected to the power supply line VL_a. Further, a gate of the transistor 234 is electrically connected to the other of the source and the drain of the transistor 231_2.

One of an anode and a cathode of the light-emitting element 235 is electrically connected to a power supply line VL_b, and the other is electrically connected to the other of the source and the drain of the transistor 234.

As the light-emitting element 235, an organic electroluminescent element or the like can be used, for example.

A potential VDD is applied to one of the power supply line VL_a and the power supply line VL_b, and a potential VSS is applied to the other thereof.

In the display device including the pixel circuit 211 illustrated in FIG. 7B2, the pixel circuits 211 are sequentially selected row by row by the gate driver 221, whereby the transistors 231_2 are turned on and a data signal is written.

When the transistors 231_2 are turned off, the pixel circuits 211 in which the data has been written are brought into a holding state. Further, the amount of current flowing between the source and the drain of the transistor 234 is controlled depending on the potential of the written data signal. The light-emitting element 235 emits light with a luminance corresponding to the amount of flowing current. This operation is sequentially performed row by row; thus, an image is displayed.

An example of a method for driving the display device illustrated in FIG. 7A in the case where the display device can be operated in a low power consumption mode is described with reference to a timing chart of FIG. 8. Here, a case of using the shift register described in Embodiment 1 as the gate driver 221 is described as an example.

The display device illustrated in FIG. 7A is operated in a normal mode or a low power consumption mode.

The operation in the normal mode is described. In the normal mode, when a start pulse signal SP, a power supply voltage PWR, and clock signals CLK1 to CLK4 are input to the shift register as shown in a period 311 in FIG. 8, the shift register sequentially outputs pulses of output signals SROUT_1 to SROUT_N and pulses of output signals OUT_1 to OUT_N in accordance with a pulse of the start pulse signal SP. Note that as the power supply voltage PWR, a power supply voltage that has a potential VDD and a potential VSS or a power supply voltage that has a potential Va and a potential VSS can be given. When the input of the clock signals CLK1 to CLK4 starts, the input of the corresponding inverted clock signals CLK1B to CLK4B also starts.

Next, the operation for changing from the normal mode to the low power consumption mode is described. In this case, as shown in a period 312 in FIG. 8, the input of the power supply voltage PWR, the clock signals CLK1 to CLK4, and the start pulse signal SP to the shift register is stopped. When the input of the clock signals CLK1 to CLK4 is stopped, the input of the corresponding inverted clock signals CLK1B to CLK4B is also stopped.

In this case, it is preferable to stop the input of the start pulse signal SP to the shift register at first, then stop the input of the clock signals CLK1 to CLK4 sequentially, and stop the input of the power supply voltage PWR. Thus, a malfunction of the shift register can be prevented.

When the input of the power supply voltage PWR, the clock signals CLK1 to CLK4, and the start pulse signal SP to the shift register is stopped, the output of the pulses of the output signals SROUT_1 to SROUT_N is stopped and the output of the pulses of the output signals OUT_1 to OUT_N is stopped. Thus, the display changes to the low power consumption mode.

Figure 8:
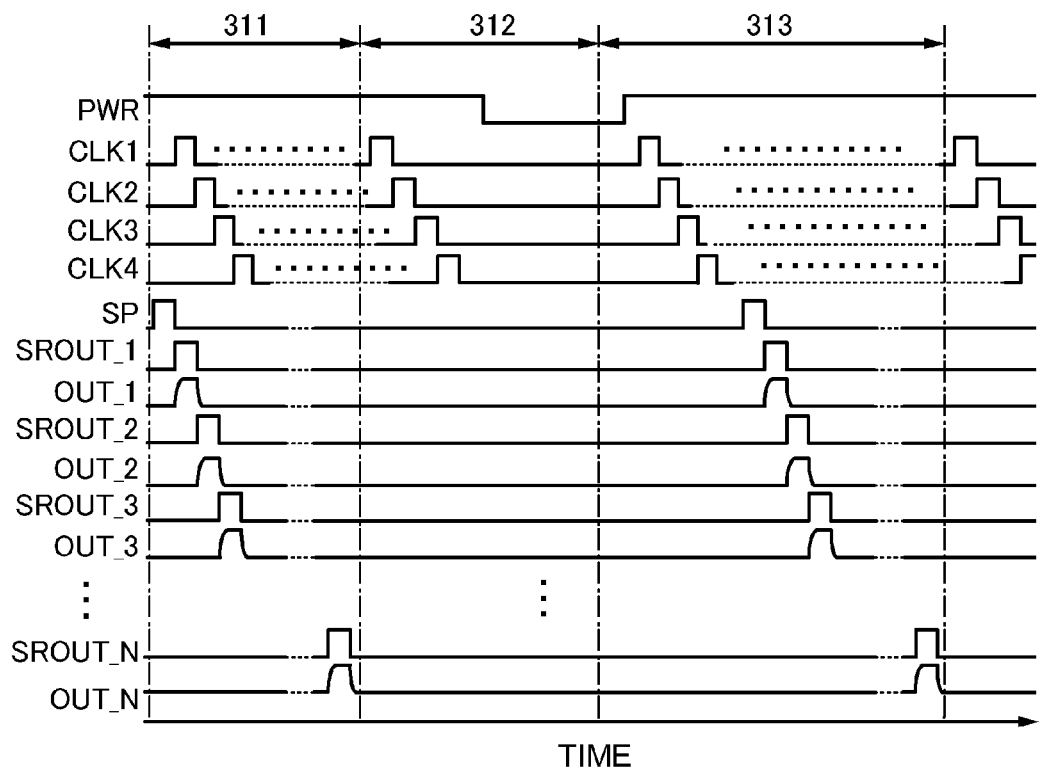
FIG. 8 illustrates an example of a display device.

To change the shift register back to the normal mode, as shown in a period 313 in FIG. 8, the input of the start pulse signal SP, the clock signals CLK1 to CLK4, and the power supply voltage PWR to the shift register is restarted.

In this period, the input of the power supply voltage PWR to the shift register is restarted first; next, the input of the clock signals CLK1 to CLK4 is restarted; and then the input of the start pulse signal SP is restarted. Moreover, in this case, it is preferable to restart inputting the clock signals CLK1 to CLK4 sequentially after the potentials of the wirings through which the clock signals CLK1 to CLK4 are input are set to the potential VDD.

When the input of the start pulse signal SP, the clock signals CLK1 to CLK4, and the power supply voltage PWR to the shift register is restarted, the shift register sequentially outputs pulses of the output signals SROUT_1 to SROUT_N and pulses of the output signals OUT_1 to OUT_N in accordance with a pulse of the start pulse signal SP. Thus, the display device changes back to the normal mode.

The above is the description of the example of the display device.

As described with reference to FIG. 8, in an example of the display device of this embodiment, the operation of a driver circuit including a shift register can be stopped as necessary. Therefore, for example, in displaying images by using pixel circuits including transistors with low off-state current, in the case where rewriting of data signals is not necessary in part or the whole, the operation of a driver circuit can be stopped to increase the rewriting interval. Accordingly, power consumption can be reduced.

Figure 9:
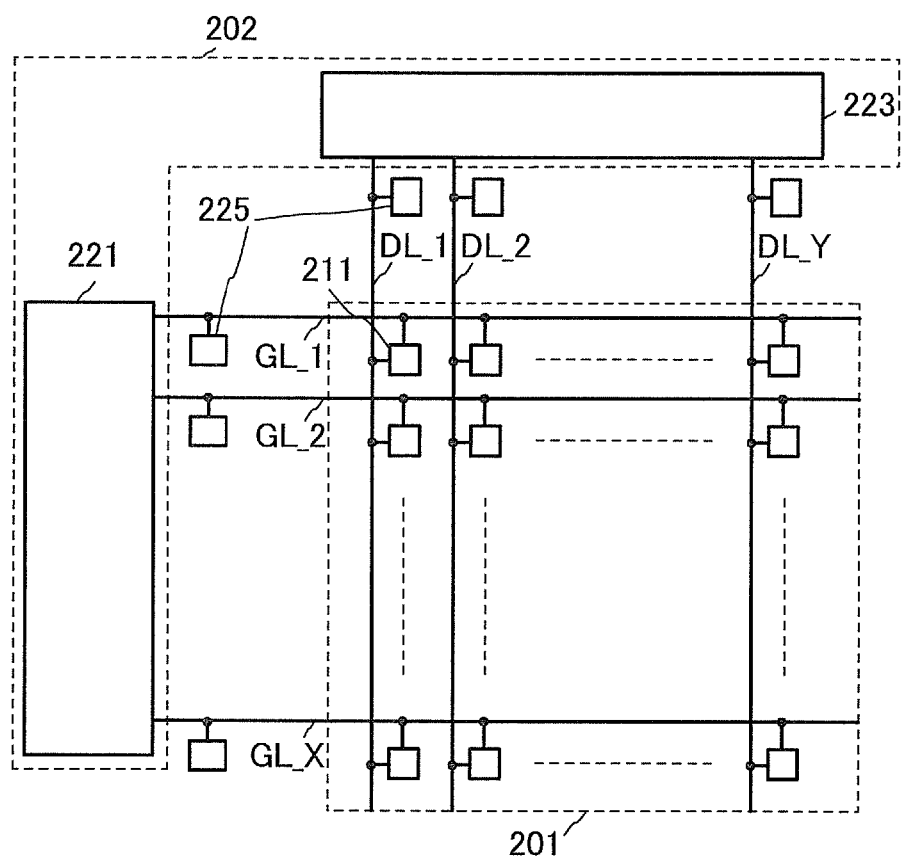
FIG. 9 illustrates an example of a display device.

As illustrated in FIG. 9, a protection circuit 225 may be connected between the gate driver 221 and the pixel circuit 211 (to the scan line GL). Further, another protection circuit 225 may be connected between the source driver 223 and the pixel circuit 211 (to the data signal line DL). Each of the protection circuits 225 is a circuit which electrically connects a wiring to which the protection circuit itself is connected to another power supply line when a potential out of a certain range is applied to the wiring. The protection circuits 225 include a diode or the like, for example.

By providing protection circuits as illustrated in FIG. 9, tolerance to overvoltage generated by ESD or the like can be increased in the display device.

As described with reference to FIG. 1A to FIG. 9, in an example of the display device of this embodiment, driver circuits such as the gate driver and the source driver are formed using the pulse output circuit described in Embodiment 1. In the driver circuits, the stress to a transistor is small; thus, the display device can have high reliability.

Examples of the structure of the display device of this embodiment are described with reference to FIGS. 10A and 10B.

Figure 10A:
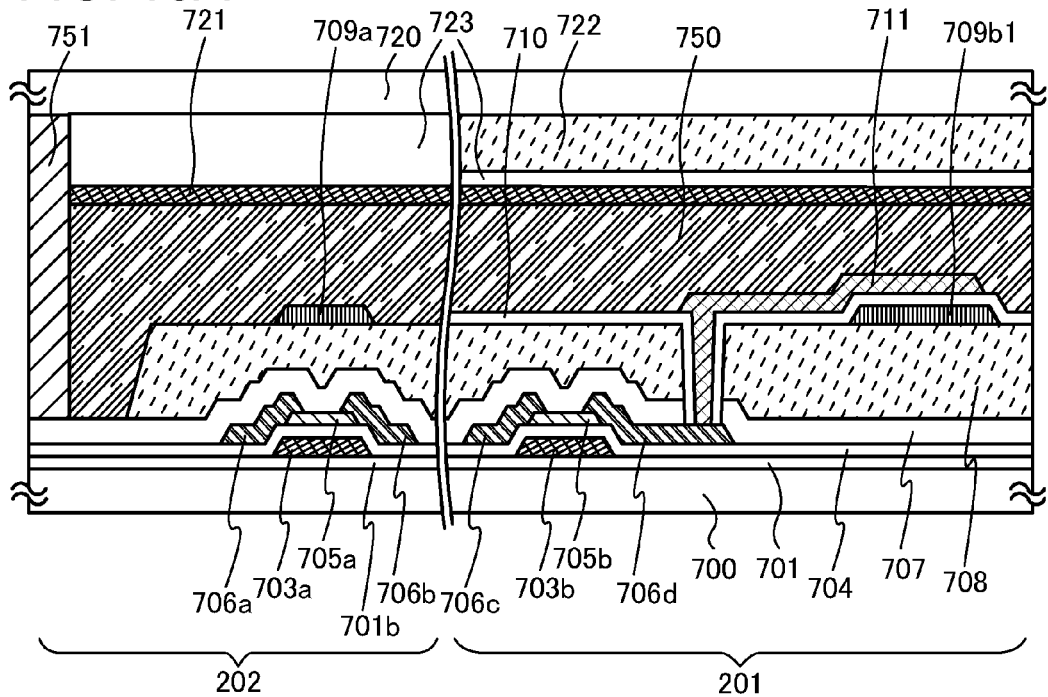
FIGS. 10A and 10B each illustrate an example of a display device.

The display device illustrated in FIG. 10A is a vertical electric field liquid crystal display device.

Conductive layers 703a and 703b are provided on the same plane over a substrate 700 with an insulating layer 701 sandwiched therebetween.

The conductive layer 703a is provided in the driver circuit portion 202. The conductive layer 703a serves as a gate of a transistor in a driver circuit.

The conductive layer 703b is provided in the pixel portion 201. The conductive layer 703b serves as a gate of a transistor in a pixel circuit.

An insulating layer 704 is provided over the conductive layers 703a and 703b. The insulating layer 704 serves as a gate insulating layer of the transistor in the driver circuit and also as a gate insulating layer of the transistor in the pixel circuit.

A semiconductor layer 705a overlaps with the conductive layer 703a with the insulating layer 704 sandwiched therebetween. The semiconductor layer 705a serves as a layer where a channel is formed (also referred to as a channel formation layer) of the transistor in the driver circuit.

A semiconductor layer 705b overlaps with the conductive layer 703b with the insulating layer 704 sandwiched therebetween. The semiconductor layer 705b serves as a channel formation layer of the transistor in the pixel circuit.

A conductive layer 706a is electrically connected to the semiconductor layer 705a. The conductive layer 706a serves as one of a source and a drain of the transistor in the driver circuit.

A conductive layer 706b is electrically connected to the semiconductor layer 705a. The conductive layer 706b serves as the other of the source and the drain of the transistor in the driver circuit.

A conductive layer 706c is electrically connected to the semiconductor layer 705b. The conductive layer 706c serves as one of a source and a drain of the transistor in the pixel circuit.

A conductive layer 706d is electrically connected to the semiconductor layer 705b. The conductive layer 706d serves as the other of the source and the drain of the transistor in the pixel circuit.

An insulating layer 707 is provided over the semiconductor layers 705a and 705b and the conductive layers 706a to 706d. The insulating layer 707 serves as an insulating layer for protecting the transistors (also referred to as a protective insulating layer).

An insulating layer 708 is provided over the insulating layer 707. The insulating layer 708 serves as a planarization layer. The insulating layer 708 can prevent parasitic capacitance from being generated between a conductive layer placed below the insulating layer 708 and a conductive layer placed above the insulating layer 708.

A conductive layer 709a and a conductive layer 709b1 are provided over the insulating layer 708.

The conductive layer 709a overlaps with the semiconductor layer 705a with the insulating layers 707 and 708 sandwiched therebetween. The conductive layer 709a serves as a gate of the transistor in the driver circuit. For example, the conductive layer 709a may serve as a back gate of the transistor in the driver circuit. For example, in the case where the transistor is of n-channel type, by applying a negative potential to the back gate, the threshold voltage of the transistor can be shifted in the positive direction. Alternatively, the back gate may be grounded.

The conductive layer 709b1 serves as one of a pair of electrodes of a capacitor in the pixel circuit.

An insulating layer 710 is provided over a surface of the insulating layer 708 and the conductive layer 709b1. The insulating layer 710 in the region over the transistor in the driver circuit may be removed, so that hydrogen or moisture in the insulating layer 708 can be released to the outside, which prevents the insulating layer 708 from peeling from the insulating layer 707. The insulating layer 710 serves as a protective insulating layer. The insulating layer 710 serves as a dielectric layer of the capacitor in the pixel circuit.

A conductive layer 711 is provided over the insulating layer 710 and electrically connected to the conductive layer 706d through an opening penetrating the insulating layer 707, the insulating layer 708, and the insulating layer 710. Further, the conductive layer 711 overlaps the conductive layer 709b1 with the insulating layer 710 sandwiched therebetween. The conductive layer 711 serves as one of a pair of electrodes of a liquid crystal element and the other of the pair of electrodes of the capacitor in the pixel circuit.

A coloring layer 722 is provided on part of a plane surface of a substrate 720. The coloring layer 722 serves as a color filter.

An insulating layer 723 is provided on one plane side of the substrate 720 with the coloring layer 722 sandwiched therebetween. The insulating layer 723 serves as a planarization layer.

The insulating layer 721 is provided on a plane surface of the insulating layer 723. The conductive layer 721 serves as the other of the pair of electrodes of the liquid crystal element in the pixel circuit. Another insulating layer may be provided over the conductive layer 721.

A liquid crystal layer 750 is provided between the conductive layer 711 and the conductive layer 721, using a sealant 751. Note that the insulating layer 707 and the insulating layer 710 in the region under the sealant 751 may be removed.

Figure 10B:
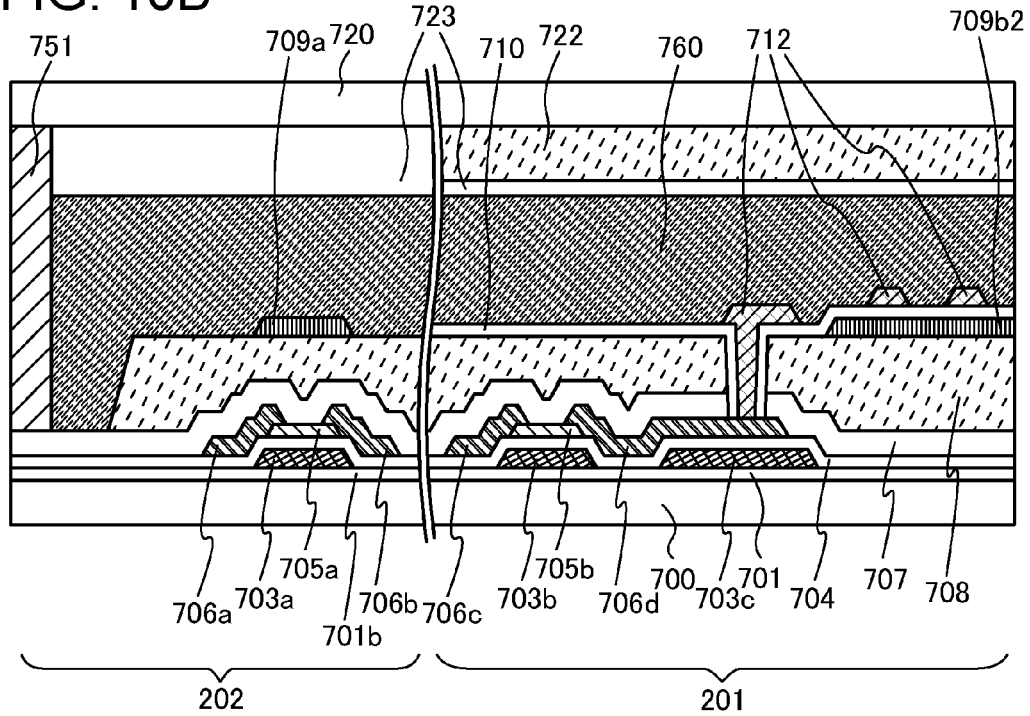

The display device illustrated in FIG. 10B is a horizontal electric field display device. As compared with the display device in FIG. 10A, the display device in FIG. 10B includes a conductive layer 703c, a conductive layer 709b2 instead of the conductive layer 709b1, a conductive layer 712 instead of the conductive layer 711, and a liquid crystal layer 760 instead of the liquid crystal layer 750. As for the same portions as those of the display device in FIG. 10A, the description for the display device in FIG. 10A can be referred to.

The conductive layer 703c is provided over the insulating layer 701. The conductive layer 706d overlaps with the conductive layer 703c with the insulating layer 704 sandwiched therebetween.

The conductive layer 709b2 is provided over the insulating layer 708. The conductive layer 709b2 serves as one of the pair of electrodes of the liquid crystal element in the pixel circuit. Further, the conductive layer 709b2 also serves as one of the pair of electrodes of the capacitor in the pixel circuit.

The conductive layer 712 is provided over the insulating layer 710 and electrically connected to the conductive layer 706d through an opening penetrating the insulating layer 707, the insulating layer 708, and the insulating layer 710. The conductive layer 712 has a comb-shaped portion; each of teeth of the comb-shaped portion overlaps with the conductive layer 709b2 with the insulating layer 710 sandwiched therebetween. The conductive layer 712 serves as the other of the pair of electrodes of the liquid crystal element in the pixel circuit. Further, the conductive layer 712 serves as the other of the pair of electrodes of the capacitor in the pixel circuit.

The liquid crystal layer 760 is provided over the conductive layer 711 and the conductive layer 712, using the sealant 751.

Note that although the transistors in FIGS. 10A and 10B are of channel-etched type, without being limited to this type, they may be of channel-protection type or top-gate type.

Next, components of the display devices illustrated in FIGS. 10A and 10B are described. Note that some of the layers may have a stacked-layer structure.

A glass substrate or a plastic substrate, can be used for the substrates 700 and 720, for example.

The insulating layer 701 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

The conductive layers 703a to 703c can be, for example, a layer containing a metal material such as molybdenum, titanium, chromium, tantalum, magnesium, silver, tungsten, aluminum, copper, neodymium, or scandium.

The insulating layer 704 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide. For example, the insulating layer 704 can be stacked layers of a silicon nitride layer and a silicon oxynitride layer. In this case, the silicon nitride layer may have stacked layers of a plurality of silicon nitride layers having different compositions. The insulating layer 704 may be an oxide layer. The oxide layer may be a layer of an oxide having a composition of In:Ga:Zn=1:3:2, for example.

As the semiconductor layers 705a and 705b, an oxide semiconductor layer can be used, for example.

For example, an In-based metal oxide, a Zn-based metal oxide, an In—Zn-based metal oxide, or an In—Ga—Zn-based metal oxide can be used as the oxide semiconductor as in Embodiment 1. Alternatively, a metal oxide including another metal element instead of part or all of Ga in the In—Ga—Zn-based metal oxide may be used. The oxide semiconductor may include a crystal. For example, the oxide semiconductor may be polycrystalline or single crystal semiconductor. Alternatively, the oxide semiconductor may be amorphous.

As the aforementioned another metal element, a metal element that is capable of being bonded to more oxygen atoms than gallium can be used, for example, and specifically one or more elements of titanium, zirconium, hafnium, germanium, and tin can be used, for instance. Alternatively, as the aforementioned another metal element, one or more elements of lanthanum, cerium, praseodymium, neodymium, samarium, europium, gadolinium, terbium, dysprosium, holmium, erbium, thulium, ytterbium, and lutetium may be used. These metal elements function as a stabilizer. Note that the amount of such a metal element added is determined so that the metal oxide can function as a semiconductor. A metal element that can be bonded to more oxygen atoms than gallium is used and oxygen is supplied to the metal oxide, whereby oxygen vacancies in the metal oxide can be reduced.

Further, the semiconductor layer 705a and the semiconductor layer 705b may have a stacked layer structure including a first oxide semiconductor layer with an atomic ratio of In:Ga:Zn=1:1:1, a second oxide semiconductor layer with an atomic ratio of In:Ga:Zn=3:1:2, and a third oxide semiconductor layer with an atomic ratio of In:Ga:Zn=1:1:1. By employing this stacked layer structure for the semiconductor layer 705a and the semiconductor layer 705b, electric field mobility of the transistors can be increased, for example.

The leakage current of the transistors including the oxide semiconductor caused by thermal excitation is small owing to wide band gap. Further, the effective mass of a hole is as heavy as 10 or more, the height of the tunnel barrier is as high as 2.8 eV or higher. Thus, the amount of tunnel current is small. Furthermore, the number of carriers in the semiconductor layer is very small; therefore, the off-state current can be made low. For example, the off-state current per micrometer of the channel width of the transistor at room temperature (25° C.) is lower than or equal to $1 \times 10^{-19}$ A (100 zA), preferably lower than or equal to $1 \times 10^{-22}$ A (100 yA). It is preferable that the off-state current of the transistor be as low as possible; the lowest level of the off-state current of the transistor is estimated to be about $1 \times 10^{-30}$ A/μm. The semiconductor layer 705a and the semiconductor layer 705b are not limited to the above-described oxide semiconductor layer and may be a semiconductor layer including a Group 14 element (e.g., silicon). For example, as the semiconductor layer including silicon, a single crystal silicon layer, a polycrystalline silicon layer, an amorphous silicon layer, or the like can be used.

The transistor including the oxide semiconductor can be fabricated in such a manner that, for example, impurities such as hydrogen or water are reduced as much as possible and oxygen vacancies are reduced as much as possible by supply of oxygen. At this time, the amount of hydrogen regarded as a donor impurity in the channel formation region is preferred to be lower than or equal to $1 \times 10^{19}/cm^3$, further preferably lower than or equal to $1 \times 10^{18}/cm^3$ by secondary ion mass spectrometry (SIMS).

By using the highly purified oxide semiconductor layer for the field-effect transistor, the carrier density of the oxide semiconductor layer can be lower than $1 \times 10^{14}/cm^3$, preferably lower than $1 \times 10^{12}/cm^3$, further preferably lower than $1 \times 10^{11}/cm^3$. Such a low carrier density can reduce the off-state current of the field-effect transistor per micrometer of channel width to $1 \times 10^{-19}$ A (100 zA) or less, preferably $1 \times 10^{-22}$ A (100 yA) or less. It is preferable that the off-state current of the field-effect transistor be as low as possible; the lower limit of the off-state current of the field-effect transistor is estimated to be approximately $1 \times 10^{-30}$ A/μm.

The oxide semiconductor may be a c-axis aligned crystalline oxide semiconductor (also referred to as CAAC-OS).

For example, the oxide semiconductor layer that is a CAAC-OS can be formed by a sputtering method. In this case, the sputtering is performed using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the sputtered particle reaches a substrate while maintaining their crystal state, whereby a crystal state of the sputtering target is transferred to a substrate. In this manner, the CAAC-OS is formed.

For the deposition of the CAAC-OS, the following conditions are preferably used.

For example, the CAAC-OS is formed while the impurity concentration is reduced, whereby the crystal state of the oxide semiconductor can be prevented from being broken by the impurities. For example, the concentration of impurities (e.g., hydrogen, water, carbon dioxide, or nitrogen) existing in a deposition chamber is preferably reduced. Further, the concentration of impurities in a deposition gas is preferably reduced. For example, a deposition gas whose dew point is −80° C. or lower, preferably −100° C. or lower is preferably used as a deposition gas.

It is preferable that the temperature of the substrate at the time of deposition be high. In the case of high temperature substrate, when the flat-plate-like sputtered particle reaches the substrate, migration of the sputtered particle occurs, so that a flat plane of the sputtered particle is attached to the substrate. For example, an oxide semiconductor film is deposited at a substrate heating temperature of higher than or equal to 100° C. and lower than or equal to 740° C., preferably higher than or equal to 200° C. and lower than or equal to 500° C.

Further, it is preferable to suppress plasma damage at the time of deposition by increasing the oxygen percentage in the deposition gas and optimizing electric power. For example, the oxygen percentage in the deposition gas is preferably 30 vol % or higher, still preferably 100 vol %.

For example, a layer containing a metal material such as molybdenum, titanium, chromium, tantalum, magnesium, silver, tungsten, aluminum, copper, neodymium, scandium, or ruthenium can be used for the conductive layers 706a to 706d.

The insulating layer 707 can be formed using a layer containing a material such as silicon oxide, silicon nitride, silicon oxynitride, silicon nitride oxide, aluminum oxide, aluminum nitride, aluminum oxynitride, aluminum nitride oxide, or hafnium oxide, for example.

As the insulating layer 708, a layer of an organic insulating material or an inorganic insulating material can be used, for example. For example, the insulating layer 708 may be formed using an acrylic resin or the like.

As the conductive layers 709a, 709b1, and 709b2, a layer of a metal oxide that functions as a conductor and transmits light or the like can be used, for example. For example, indium zinc oxide, indium tin oxide, or the like can be used.

The insulating layer 710 can be formed using a material which can be used for the insulating layer 704, for example.

As the conductive layers 711, 712, and 721, a layer of a metal oxide that transmits light or the like can be used, for example. For example, indium zinc oxide, indium tin oxide, or the like can be used.

For example, the coloring layer 722 has a function of transmitting light of one of red (R), green (G), and blue (B). As the coloring layer 722, a layer including a dye or a pigment can be used.

As the insulating layer 723, a layer containing a material such as silicon oxide, silicon nitride, silicon oxynitride, silicon nitride oxide, aluminum oxide, aluminum nitride, aluminum oxynitride, aluminum nitride oxide, or hafnium oxide can be used, for example.

For the liquid crystal layer 750, a layer including TN liquid crystal, OCB liquid crystal, STN liquid crystal, VA liquid crystal, ECB liquid crystal, GH liquid crystal, polymer dispersed liquid crystal, discotic liquid crystal, or the like can be used, for example.

As the liquid crystal layer 760, a layer including liquid crystal exhibiting a blue phase can be used, for example.

A layer including liquid crystal exhibiting a blue phase contains a liquid crystal composition including liquid crystal exhibiting a blue phase, a chiral material, a liquid-crystalline monomer, a non-liquid-crystalline monomer, and a polymerization initiator. The liquid crystal exhibiting a blue phase has a short response time, and has optical isotropy that contributes to the exclusion of the alignment process and reduction of viewing angle dependence. Therefore, with the liquid crystal exhibiting a blue phase, the operation speed of the liquid crystal display device can be increased.

The above is the description of the structural examples of the display devices illustrated in FIGS. 10A and 10B.

In examples of the display device of this embodiment, a driver circuit is provided over the same substrate as a pixel circuit as described with reference to FIGS. 10A and 10B. Thus, the number of wirings for connecting the pixel circuit to the driver circuit can be reduced.

Embodiment 3

In this embodiment, examples of an electronic device provided with a panel using the display device of Embodiment 2 are described with reference to FIGS. 11A to 11D.

Figure 11A:
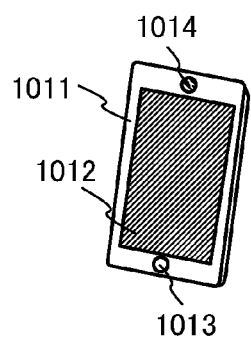
FIGS. 11A to 11D each illustrate an electronic device.

The electronic device in FIG. 11A is an example of a portable information terminal.

The electronic device illustrated in FIG. 11A includes a housing 1011, a panel 1012 provided in the housing 1011, a button 1013, and a speaker 1014.

The housing 1011 may be provided with a connection terminal for connecting the electronic device to an external device and a button for operating the electronic device.

The panel 1012 may be formed using the display device in Embodiment 2.

The panel 1012 may be a touch panel; in this case, touch detection can be performed on the panel 1012. As the touch panel, an optical touch panel, a capacitive touch panel, a resistive touch panel, or the like can be used, for example.

The button 1013 is provided on the housing 1011. For example, when the button 1013 is a power button, pressing the button 1013 can turn on or off the electronic device.

The speaker 1014 is provided on the housing 1011. The speaker 1014 outputs sound.

Note that a microphone may be provided on the housing 1011; in such a case, the electronic device illustrated in FIG. 11A can function as a telephone, for example.

The electronic device illustrated in FIG. 11A functions as one or more of a telephone, an e-book reader, a personal computer, and a game machine, for example.

Figure 11B:
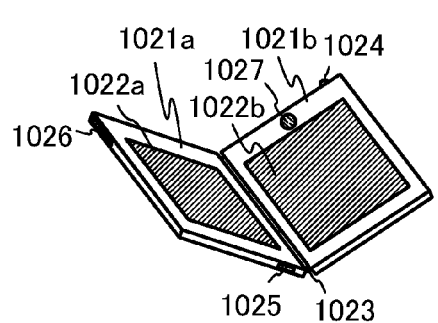

The electronic device illustrated in FIG. 11B is an example of a folding digital assistant.

The electronic device illustrated in FIG. 11B includes a housing 1021a, a housing 1021b, a panel 1022a provided in the housing 1021a, a panel 1022b provided in the housing 1021b, a hinge 1023, a button 1024, a connection terminal 1025, a storage medium inserting portion 1026, and a speaker 1027.

The housing 1021a and the housing 1021b are connected by the hinge 1023.

The panel 1022a and the panel 1022b may be formed using the display device in Embodiment 2.

The panel 1022a and the panel 1022b may be touch panels; in this case, touch detection can be performed on the panel 1022a and the panel 1022b. As the touch panels, an optical touch panel, a capacitive touch panel, a resistive touch panel, or the like can be used, for example.

Since the electronic device in FIG. 11B includes the hinge 1023, it can be folded so that the panels 1022a and 1022b face each other.

The button 1024 is provided on the housing 1021b. Note that the housing 1021a may also be provided with the button 1024. For example, when the button 1024 is a power button, pressing the button 1024 can turn on or off the electronic device.

The connection terminal 1025 is provided on the housing 1021a. Note that the connection terminal 1025 may be provided on the housing 1021b. Alternatively, a plurality of connection terminals 1025 may be provided on one or both of the housings 1021a and 1021b. The connection terminal 1025 is a terminal for connecting the electronic device illustrated in FIG. 11B to another device.

The storage medium inserting portion 1026 is provided on the housing 1021a. The storage medium inserting portion 1026 may be provided on the housing 1021b. Alternatively, a plurality of storage medium inserting portions 1026 may be provided on one or both of the housings 1021a and 1021b. For example, a card-type recording medium is inserted into the recording medium insertion portion so that data can be read to the electronic device from the card-type recording medium or data stored in the electronic device can be written to the card-type recording medium.

The speaker 1027 is provided on the housing 1021b. The speaker 1027 outputs sound. Note that the speaker 1027 may be provided on the housing 1021a.

Note that a microphone may be provided on the housing 1021a or the housing 1021b; in such a case, the electronic device illustrated in FIG. 11B can function as a telephone, for example.

The electronic device illustrated in FIG. 11B functions as one or more of a telephone, an e-book reader, a personal computer, and a game machine, for example.

Figure 11C:
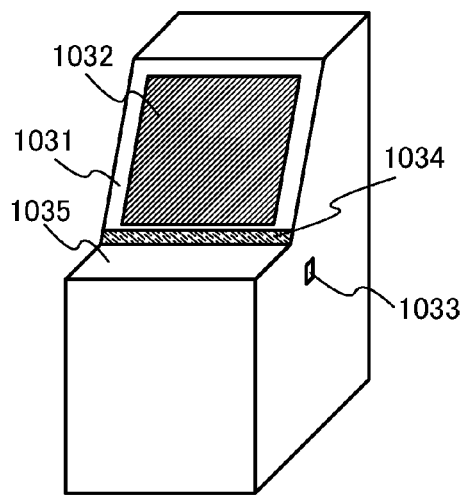

The electronic device in FIG. 11C is an example of a stationary information terminal. The electronic device illustrated in FIG. 11C includes a housing 1031, a panel 1032 provided in the housing 1031, a button 1033, and a speaker 1034.

The panel 1032 may be formed using the display device in Embodiment 2.

The panel 1032 may be a touch panel; in this case, touch detection can be performed on the panel 1032. As the touch panel, an optical touch panel, a capacitive touch panel, a resistive touch panel, or the like can be used, for example.

Note that a panel similar to the panel 1032 may be provided on a deck portion 1035 of the housing 1031.

The housing 1031 may be provided with one or more of a ticket slot from which a ticket or the like is dispensed, a coin slot, and a bill slot.

The button 1033 is provided on the housing 1031. For example, when the button 1033 is a power button, pressing the button 1033 can turn on or off the electronic device.

The speaker 1034 is provided on the housing 1031. The speaker 1034 outputs sound.

The electronic device illustrated in FIG. 11C has, for example, a function as an automated teller machine, an information communication terminal for ordering a ticket or the like (also referred to as a multi-media station), or a game machine.

Figure 11D:
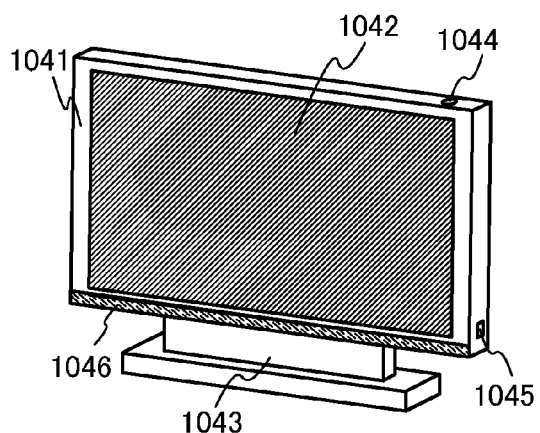

FIG. 11D illustrates another example of a stationary information terminal. The electronic device illustrated in FIG. 11D includes a housing 1041, a panel 1042 provided in the housing 1041, a support base 1043 supporting the housing 1041, a button 1044, a connection terminal 1045, and a speaker 1046.

Note that a connection terminal for connecting the housing 1041 to an external device may be provided.

The panel 1042 may be formed using the display device in Embodiment 2.

The panel 1042 may be a touch panel; in this case, touch detection can be performed on the panel 1042. As the touch panel, an optical touch panel, a capacitive touch panel, a resistive touch panel, or the like can be used, for example.

The button 1044 is provided on the housing 1041. For example, when the button 1044 is a power button, pressing the button 1044 can turn on or off the electronic device.

The connection terminal 1045 is provided on the housing 1041. The connection terminal 1045 is a terminal for connecting the electronic device illustrated in FIG. 11D to another device. For example, when the electronic device in FIG. 11D and a personal computer are connected with the connection terminal 1045, the panel 1042 can display an image corresponding to a data signal input from the personal computer. For example, when the panel 1042 of the electronic device illustrated in FIG. 11D is larger than a panel of an electronic device connected thereto, a displayed image of the electronic device can be enlarged, in which case a plurality of viewers can recognize the image at the same time with ease.

The speaker 1046 is provided on the housing 1041. The speaker 1046 outputs sound.

The electronic device illustrated in FIG. 11D functions as, for example, an output monitor, a personal computer, and/or a television set.

The above is the description of the electronic devices illustrated in FIGS. 11A to 11D.

When the display device in Embodiment 2 is used in a panel of an electronic device of this embodiment as described with reference to FIGS. 11A to 11D, the electronic device can have high reliability.

This application is based on Japanese Patent Application serial no. 2012-161253 filed with Japan Patent Office on Jul. 20, 2012, the entire contents of which are hereby incorporated by reference.

What is claimed is:

1. A pulse output circuit comprising:
a first transistor, one of a source and a drain of the first transistor being electrically connected to a first wiring to which a first clock signal is supplied;
a second transistor, one of a source and a drain of the second transistor being electrically connected to the other of the source and the drain of the first transistor, and the other of the source and the drain of the second transistor being electrically connected to a second wiring to which a first potential is supplied;
a third transistor, a gate of the third transistor being electrically connected to a third wiring to which a second clock signal is supplied, one of a source and a drain of the third transistor being electrically connected to a gate of the first transistor, and the other of the source and the drain of the third transistor being electrically connected to a fourth wiring to which a second potential is supplied;
a fourth transistor, a gate of the fourth transistor being electrically connected to a fifth wiring to which a third clock signal is supplied, and one of a source and a drain of the fourth transistor being electrically connected to the gate of the first transistor; and
a fifth transistor, a gate of the fifth transistor being electrically connected to a sixth wiring to which a reset signal is supplied, one of a source and a drain of the fifth transistor being electrically connected to the gate of the second transistor, and the other of the source and the drain of the fifth transistor being electrically connected to a seventh wiring to which a third potential is supplied,
wherein a potential of the gate of the first transistor is configured to be changed by the third transistor and the fourth transistor in accordance with the second clock signal and the third clock signal in a period during the pulse output circuit outputs a low-level signal.

2. The pulse output circuit according to claim 1, further comprising a capacitor,
wherein one electrode of the capacitor is electrically connected to the gate of the first transistor, and
wherein the other electrode of the capacitor is electrically connected to the other of the source and the drain of the first transistor.

3. The pulse output circuit according to claim 1, further comprising a sixth transistor,
wherein a gate of the sixth transistor is electrically connected to an eighth wiring to which a set signal is supplied,
wherein one of a source and a drain of the sixth transistor is electrically connected to the other of the source and the drain of the fourth transistor, and
wherein the other of the source and the drain of the sixth transistor is electrically connected to the seventh wiring to which the third potential is supplied.

4. The pulse output circuit according to claim 1, further comprising a seventh transistor,
wherein a gate of the seventh transistor is electrically connected to an eighth wiring to which a set signal is supplied,
wherein one of a source and a drain of the seventh transistor is electrically connected to the gate of the second transistor, and
wherein the other of the source and the drain of the seventh transistor is electrically connected to the second wiring to which the second potential is supplied.

5. The pulse output circuit according to claim 1,
wherein the pulse output circuit is configured to output a high-level signal or the low-level signal from the other of the source and the drain of the first transistor, in accordance with the first clock signal, the second clock signal, and the third clock signal.

6. The pulse output circuit according to claim 1,
wherein a difference between the second potential and the first potential is larger than a threshold voltage of the first transistor.

7. The pulse output circuit according to claim 1,
wherein a channel formation region of each of the first transistor, the second transistor, the third transistor, the fourth transistor, and the fifth transistor comprises an oxide semiconductor.

8. A display device comprising the pulse output circuit according to claim 1.

9. A pulse output circuit comprising:
a first transistor, one of a source and a drain of the first transistor being electrically connected to a first wiring to which a first clock signal is supplied;
a second transistor, one of a source and a drain of the second transistor being electrically connected to the other of the source and the drain of the first transistor, and the other of the source and the drain of the second transistor being electrically connected to a second wiring to which a first potential is supplied;
a third transistor, a gate of the third transistor being electrically connected to a third wiring to which a second clock signal is supplied, one of a source and a drain of the third transistor being electrically connected to a gate of the first transistor, and the other of the source and the drain of the third transistor being electrically connected to a fourth wiring to which a second potential is supplied;
a fourth transistor, a gate of the fourth transistor being electrically connected to a fifth wiring to which a third clock signal is supplied, and one of a source and a drain of the fourth transistor being electrically connected to the gate of the first transistor; and
a fifth transistor, a gate of the fifth transistor being electrically connected to a sixth wiring to which a reset signal is supplied, one of a source and a drain of the fifth transistor being electrically connected to the gate of the second transistor, and the other of the source and the drain of the fifth transistor being electrically connected to a seventh wiring to which a third potential is supplied,
wherein a potential of the gate of the first transistor is configured to be set to the second potential by turning on the third transistor and turning off the fourth transistor in accordance with the second clock signal and the third clock signal in a period during the pulse output circuit outputs a low-level signal.

10. The pulse output circuit according to claim 9, further comprising a capacitor,
wherein one electrode of the capacitor is electrically connected to the gate of the first transistor, and
wherein the other electrode of the capacitor is electrically connected to the other of the source and the drain of the first transistor.

11. The pulse output circuit according to claim 9, further comprising a sixth transistor,
wherein a gate of the sixth transistor is electrically connected to a sixth an eighth wiring to which a set signal is supplied,
wherein one of a source and a drain of the sixth transistor is electrically connected to the other of the source and the drain of the fourth transistor, and
wherein the other of the source and the drain of the sixth transistor is electrically connected to the seventh wiring to which the third potential is supplied.

12. The pulse output circuit according to claim 9, further comprising a seventh transistor,
wherein a gate of the seventh transistor is electrically connected to an eighth wiring to which a set signal is supplied,
wherein one of a source and a drain of the seventh transistor is electrically connected to the gate of the second transistor, and
wherein the other of the source and the drain of the seventh transistor is electrically connected to the second wiring to which the second potential is supplied.

13. The pulse output circuit according to claim 9,
wherein the pulse output circuit is configured to output a high-level signal or the low-level signal from the other of the source and the drain of the first transistor, in accordance with the first clock signal, the second clock signal, and the third clock signal.

14. The pulse output circuit according to claim 9,
wherein a difference between the second potential and the first potential is larger than a threshold voltage of the first transistor.

15. The pulse output circuit according to claim 9,
wherein a channel formation region of each of the first transistor, the second transistor, the third transistor, the fourth transistor, and the fifth transistor comprises an oxide semiconductor.

16. A display device comprising the pulse output circuit according to claim 9.

17. A pulse output circuit comprising:
a first transistor, one of a source and a drain of the first transistor being electrically connected to a first wiring to which a first clock signal is supplied;
a second transistor, one of a source and a drain of the second transistor being electrically connected to the other of the source and the drain of the first transistor, and the other of the source and the drain of the second transistor being electrically connected to a second wiring to which a first potential is supplied;
a third transistor, a gate of the third transistor being electrically connected to a third wiring to which a second clock signal is supplied, one of a source and a drain of the third transistor being electrically connected to a gate of the first transistor, and the other of the source and the drain of the third transistor being electrically connected to a fourth wiring to which a second potential is supplied;
a fourth transistor, a gate of the fourth transistor being electrically connected to a fifth wiring to which a third clock signal is supplied, and one of a source and a drain of the fourth transistor being electrically connected to the gate of the first transistor; and
a fifth transistor, a gate of the fifth transistor being electrically connected to a sixth wiring to which a reset signal is supplied, one of a source and a drain of the fifth transistor being electrically connected to the gate of the second transistor, and the other of the source and the drain of the fifth transistor being electrically connected to a seventh wiring to which a third potential is supplied.

18. The pulse output circuit according to claim 17, further comprising a sixth transistor,
wherein a gate of the sixth transistor is electrically connected to an eighth wiring to which a set signal is supplied,
wherein one of a source and a drain of the sixth transistor is electrically connected to the other of the source and the drain of the fourth transistor, and
wherein the other of the source and the drain of the sixth transistor is electrically connected to the seventh wiring to which the third potential is supplied.

19. The pulse output circuit according to claim 17, further comprising a seventh transistor,
wherein a gate of the seventh transistor is electrically connected to an eighth wiring to which a set signal is supplied,
wherein one of a source and a drain of the seventh transistor is electrically connected to the gate of the second transistor, and
wherein the other of the source and the drain of the seventh transistor is electrically connected to the second wiring to which the second potential is supplied.

20. The pulse output circuit according to claim 17,
wherein a channel formation region of each of the first transistor, the second transistor, the third transistor, the fourth transistor, and the fifth transistor comprises an oxide semiconductor.

* * * * *

UNITED STATES PATENT AND TRADEMARK OFFICE
CERTIFICATE OF CORRECTION

PATENT NO. : 9,058,889 B2
APPLICATION NO. : 13/937559
DATED : June 16, 2015
INVENTOR(S) : Hiroyuki Miyake It is certified that error appears in the above-identified patent and that said Letters Patent is hereby corrected as shown below:

In the specification

At column 4, line 67, "100 nm" should be --100 nm.--;

At column 5, line 44, "when 28" should be --when $2\theta$--;

In the claims

In claim 11, at column 25, line 41, delete "a sixth".

Signed and Sealed this
Fifteenth Day of December, 2015

Michelle K. Lee
*Director of the United States Patent and Trademark Office*